United States Patent
Golda et al.

(10) Patent No.: US 9,828,244 B2
(45) Date of Patent: Nov. 28, 2017

(54) COMPLIANT ELECTROSTATIC TRANSFER HEAD WITH DEFINED CAVITY

(71) Applicant: Apple Inc., Santa Clara, CA (US)

(72) Inventors: Dariusz Golda, Redwood City, CA (US); Stephen P. Bathurst, Layfayette, CA (US); John A. Higginson, Santa Clara, CA (US); Andreas Bibl, Los Altos, CA (US); Jeffrey Birkmeyer, San Jose, CA (US)

(73) Assignee: APPLE INC., Cupertino, CA (US)

( * ) Notice: Subject to any disclaimer, the term of this patent is extended or adjusted under 35 U.S.C. 154(b) by 100 days.

(21) Appl. No.: 14/502,994

(22) Filed: Sep. 30, 2014

(65) Prior Publication Data
US 2016/0094160 A1    Mar. 31, 2016

(51) Int. Cl.
*H01H 59/00* (2006.01)
*H01L 41/113* (2006.01)
*B81C 99/00* (2010.01)

(52) U.S. Cl.
CPC ....... *B81C 99/002* (2013.01); *H01H 59/0009* (2013.01); *H01L 41/113* (2013.01)

(58) Field of Classification Search
CPC ....... H01H 59/0009; H01H 2059/0027; H01H 1/0036; H01H 2001/0084; H01H 2037/008; H01H 2059/0018; H01L 2924/0002; H01L 21/76898; H01L 23/5384; H01L 24/75; H01L 2924/00; H01L 21/6835; H01L 2221/68368; H01L 2221/68381; H01L 2224/7598; H01L 24/95; H01L 41/113; H01L 41/1132; H01L 41/1134; H01L 41/1138; H02N 13/00

See application file for complete search history.

(56) References Cited

U.S. PATENT DOCUMENTS 3,717,743 A    2/1973    Costello
3,935,986 A    2/1976    Lattari et al.
(Continued)

FOREIGN PATENT DOCUMENTS

| JP | 07-060675 A | 3/1995 |
| JP | 11-142878 | 5/1999 |
| JP | 2001-298072 A | 10/2001 |
| JP | 2001-353682 A | 12/2001 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — Davienne Monbleau
*Assistant Examiner* — Leslie Pilar Cruz
(74) *Attorney, Agent, or Firm* — Rutan & Tucker, LLP

(57) ABSTRACT

A compliant electrostatic transfer head and method of forming a compliant electrostatic transfer head are described. In an embodiment, a compliant electrostatic transfer head includes a base substrate, a cavity template layer on the base substrate, a first confinement layer between the base substrate and the cavity template layer, and a patterned device layer on the cavity template layer. The patterned device layer includes an electrode that is deflectable toward a cavity in the cavity template layer. In an embodiment, a second confinement layer is between the cavity template layer and the patterned device layer.

20 Claims, 33 Drawing Sheets

(56) References Cited

U.S. PATENT DOCUMENTS

| | | |
|---|---|---|
| 5,131,582 A | 7/1992 | Kaplan et al. |
| 5,378,926 A | 1/1995 | Chi et al. |
| 5,435,857 A | 7/1995 | Han et al. |
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,081,414 A | 6/2000 | Flanigan et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,585,703 B2 | 9/2009 | Matsumura et al. |
| 7,628,309 B1 | 12/2009 | Erikssen et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,383,506 B1 | 2/2013 | Golda et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,426,227 B1 | 4/2013 | Bibl et al. |
| 8,518,204 B2 | 8/2013 | Hu et al. |
| 8,569,115 B1 | 10/2013 | Golda et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0076006 A1* | 4/2003 | Suzuki ............... H01H 59/0009 310/309 |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2006/0038291 A1 | 2/2006 | Chung et al. |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2006/0226934 A1* | 10/2006 | Ohguro ............... H01H 59/0009 335/78 |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2007/0284604 A1 | 12/2007 | Slater et al. |
| 2008/0048206 A1 | 2/2008 | Lee et al. |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0206702 A1* | 8/2009 | Kawakubo ............ B81B 3/0008 310/330 |
| 2009/0242918 A1 | 10/2009 | Edmond et al. |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0276726 A1 | 11/2010 | Cho et al. |
| 2011/0001145 A1 | 1/2011 | Park |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0244611 A1 | 10/2011 | Kim |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0018494 A1 | 1/2012 | Jang et al. |
| 2012/0064642 A1 | 3/2012 | Huang et al. |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0126098 A1 | 5/2013 | Bibl et al. |
| 2013/0127020 A1 | 5/2013 | Bibl et al. |
| 2013/0130416 A1 | 5/2013 | Bibl et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |
| 2013/0300812 A1 | 11/2013 | Bibl et al. |
| 2013/0316529 A1 | 11/2013 | Golda et al. |
| 2014/0008813 A1 | 1/2014 | Golda et al. |
| 2014/0048909 A1 | 2/2014 | Golda et al. |
| 2014/0064904 A1 | 3/2014 | Bibl et al. |
| 2014/0071580 A1 | 3/2014 | Higginson et al. |
| 2014/0158415 A1 | 6/2014 | Golda et al. |
| 2014/0159324 A1 | 6/2014 | Golda et al. |
| 2014/0169924 A1 | 6/2014 | Golda et al. |
| 2014/0169927 A1 | 6/2014 | Golda et al. |
| 2014/0196851 A1 | 7/2014 | Golda et al. |
| 2014/0209248 A1 | 7/2014 | Golda et al. |

(56) References Cited

U.S. PATENT DOCUMENTS

| | | | |
|---|---|---|---|
| 2014/0241843 A1 | 8/2014 | Golda et al. | |
| 2014/0241844 A1 | 8/2014 | Golda et al. | |
| 2015/0370063 A1* | 12/2015 | Agren | H01L 23/481 359/221.2 |

FOREIGN PATENT DOCUMENTS

| | | | | |
|---|---|---|---|---|
| JP | 2002-134822 A | 5/2002 | | |
| JP | 2002-164695 A | 6/2002 | | |
| JP | 2002-176291 A | 6/2002 | | |
| JP | 2002-240943 A | 8/2002 | | |
| JP | 2004-095944 A | 3/2004 | | |
| JP | 2008-200821 A | 9/2008 | | |
| JP | 2010-056458 A | 3/2010 | | |
| JP | 2010-161212 A | 7/2010 | | |
| JP | 2010-186829 A | 8/2010 | | |
| JP | 2011-181834 A | 9/2011 | | |
| KR | 10-0610632 B1 | 8/2006 | | |
| KR | 10-2007-0042214 A | 4/2007 | | |
| KR | 10-2007-0093091 A | 9/2007 | | |
| KR | 10-0973928 B1 | 8/2010 | | |
| KR | 10-1001454 B1 | 12/2010 | | |
| KR | 10-2007-0006885 A | 1/2011 | | |
| KR | 10-2011-0084888 A | 7/2011 | | |
| SE | WO 2013191618 A1 * | 12/2013 | | H01L 23/481 |
| WO | WO 2005-099310 A2 | 10/2005 | | |
| WO | WO 2011/123285 | 10/2011 | | |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.
"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.
Guerre, Roland, et al, "Selective Transfer Technology for Microdevice Distribution" Journal of Microelectromechanical Systems, vol. 17, No. 1, Feb. 2008, pp. 157-165.
Han, Min-Koo, "AM backplane for AMOLED" Proc. Of ASID '06, Oct. 8-12, New Delhi, pp. 53-58.
Harris, Jonathan H., "Sintered Aluminum Nitride Ceramics for High-Power Electronic Applications" Journal of the Minerals, Metals and Materials Society, vol. 50, No. 6, Jun. 1998, p. 56.
Horwitz, Chris M., "Electrostatic Chucks: Frequently Asked Questions" Electrogrip, 2006, 10 pgs, accessed at www.electrogrip.com.
Hossick-Schott, Joachim, "Prospects for the ultimate energy density of oxide-based capacitor anodes" Proceedings of Carts Europe, Barcelona, Spain, 2007, 10 pgs.
Lee, San Youl, et al., "Wafer-level fabrication of GAN-based vertical light-emitting diodes using a multi-functional bonding material system" Semicond. Sci. Technol. 24, 2009, 4 pgs.
"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.
Mei, Zequn, et al., "Low-Temperature Solders" Hewlett-Packard Journal, Article 10, Aug. 1996, pp. 1-10.
Mercado, Lei, L., et al., "A Mechanical Approach to Overcome RF MEMS Switch Stiction Problem" 2003 Electronic Components and Technology Conference, pp. 377-384.
Miskys, Claudio R., et al., "Freestanding GaN-substrates and devices" phys. Stat. sol. © 0, No. 6, 2003, pp. 1627-1650.
"Principles of Electrostatic Chucks: 1—Techniques for High Performance Grip and Release" ElectroGrip, Principles1 rev3 May 2006, 2 pgs, accessed at www.electrogrip.com.
Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.
Widas, Robert, "Electrostatic Substrate Clamping for Next Generation Semiconductor Devices" Apr. 21, 1999, 4 pgs.

* cited by examiner

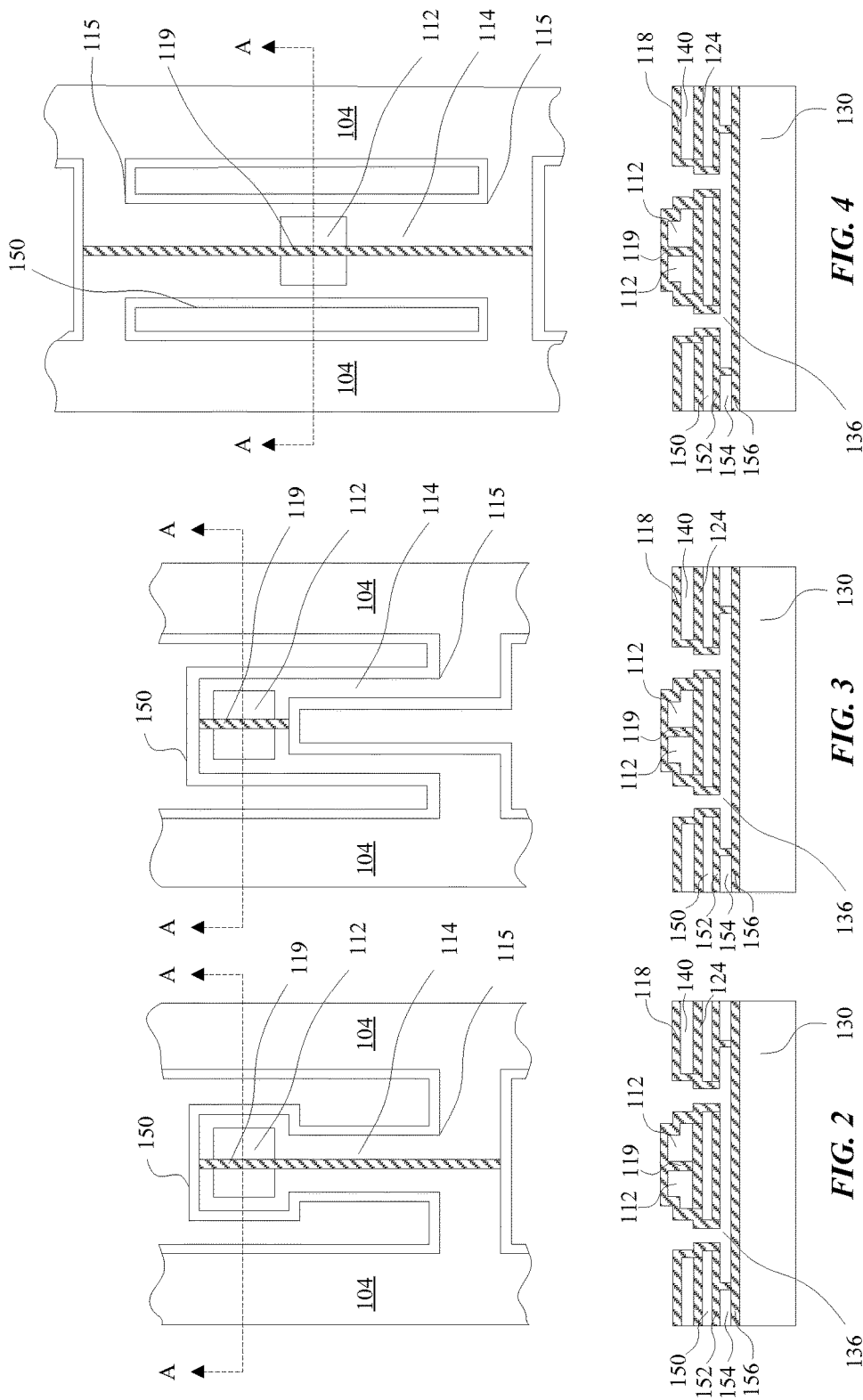

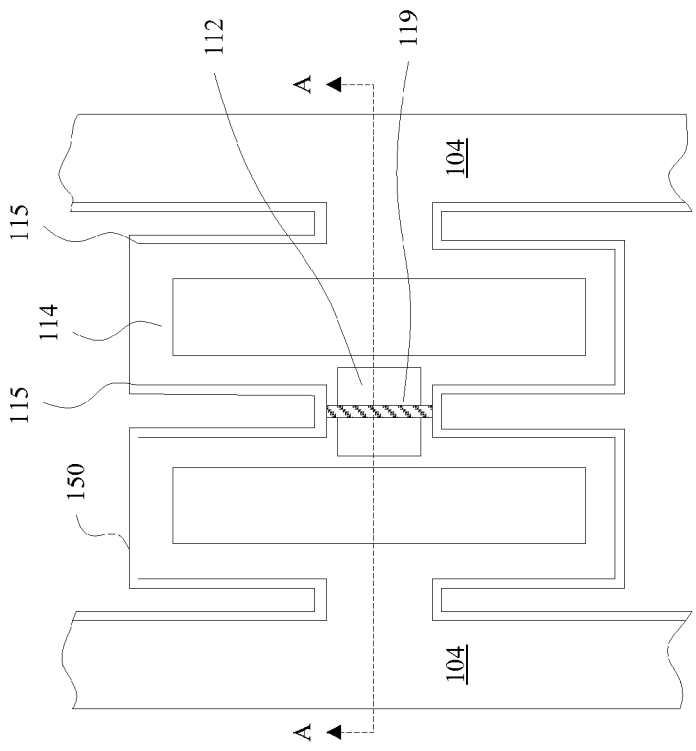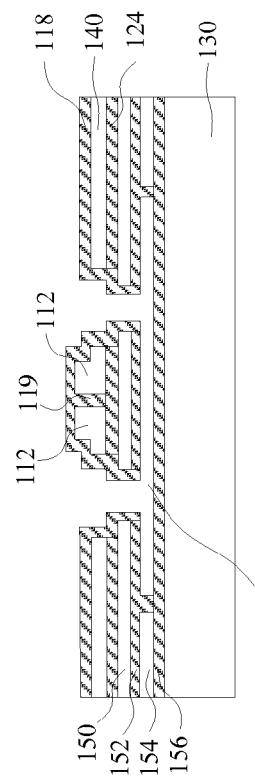
FIG. 5
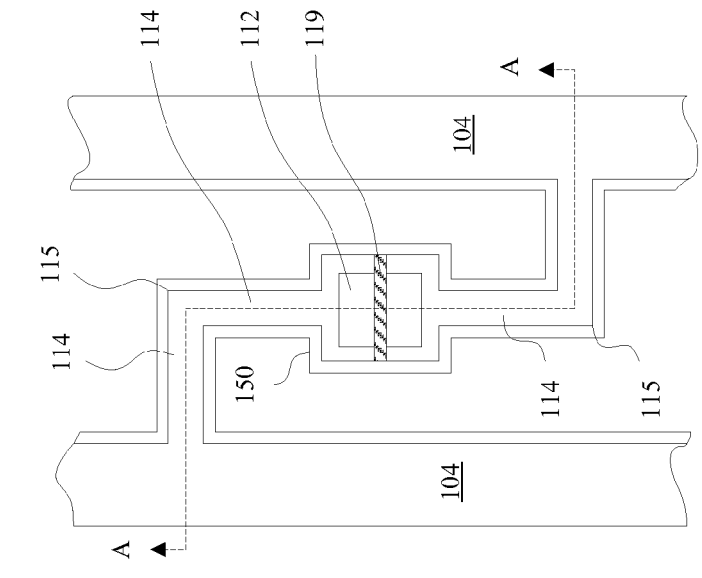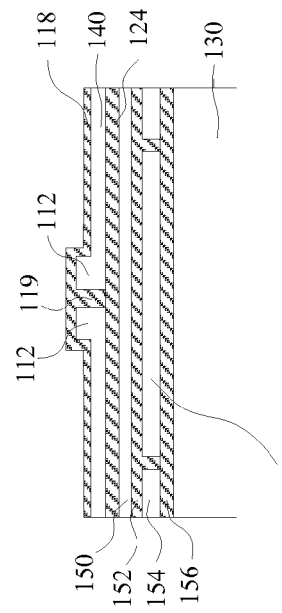
FIG. 6

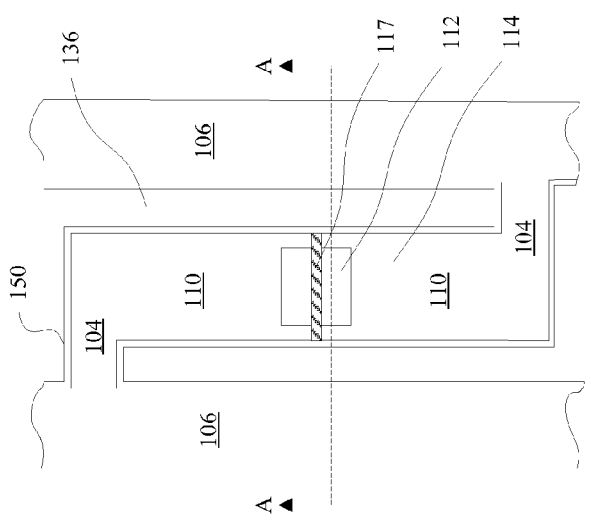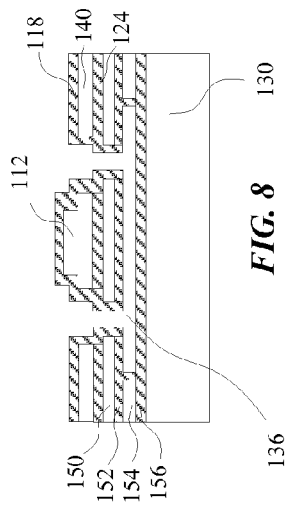
FIG. 8
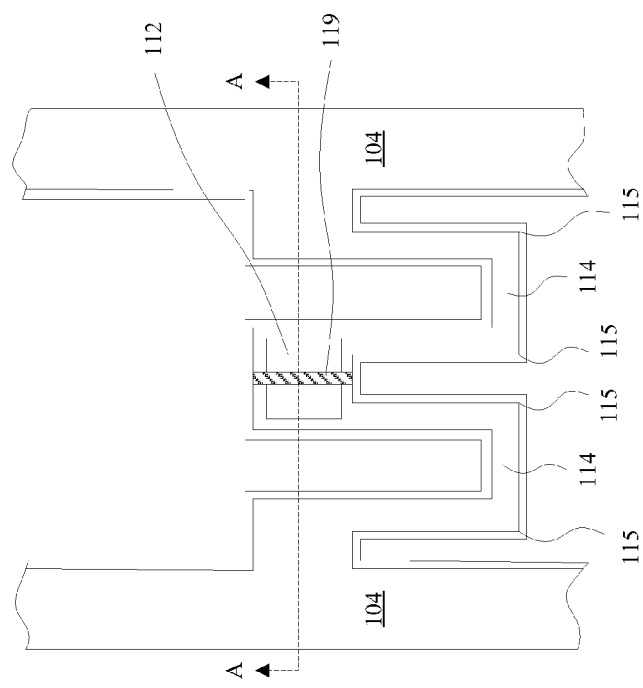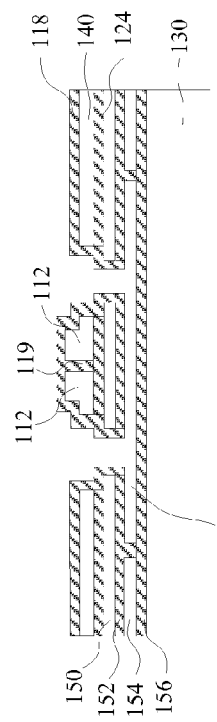
FIG. 7

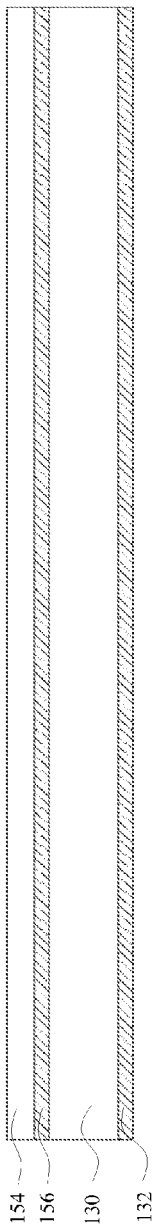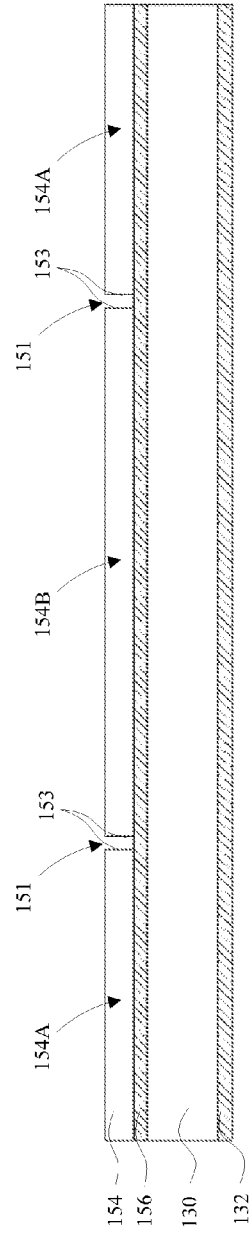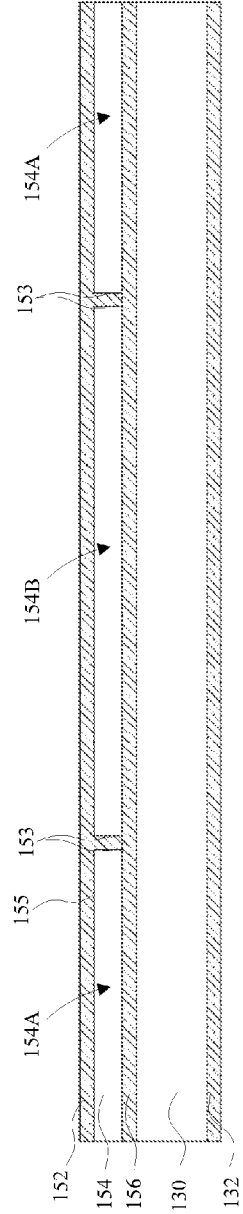

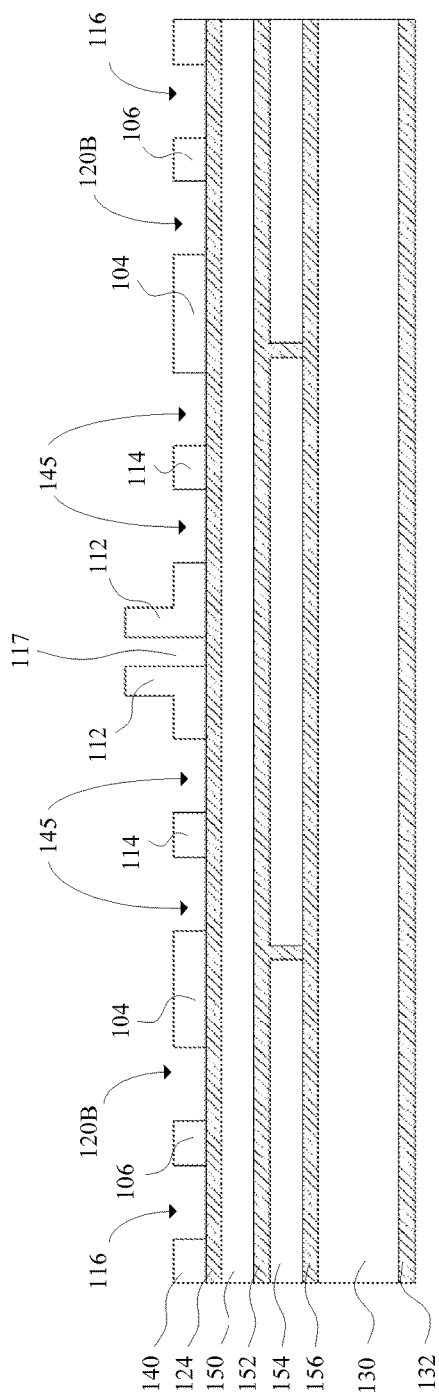
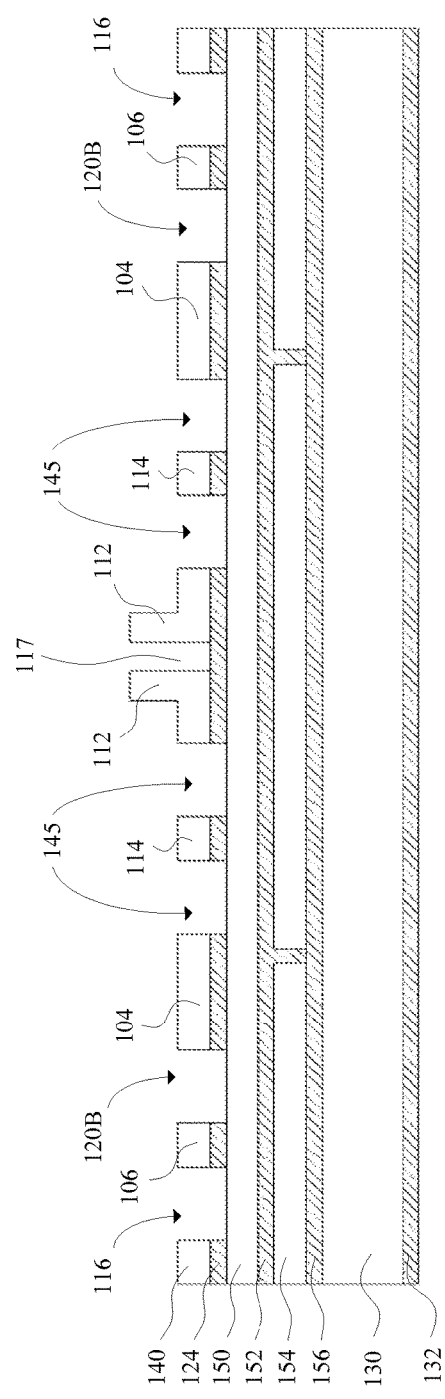
FIG. 22
FIG. 23

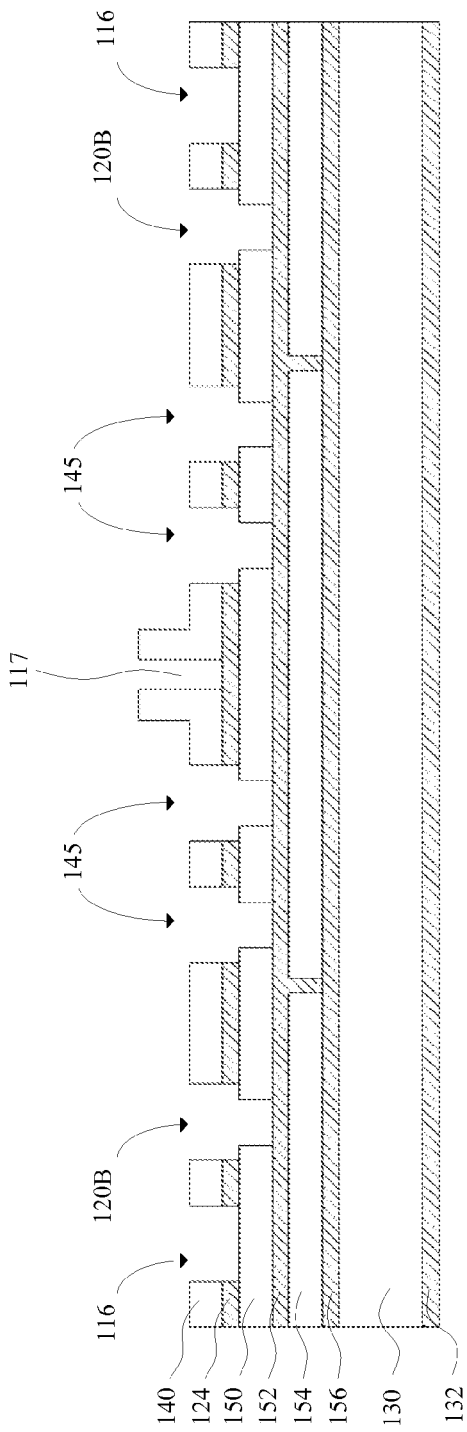
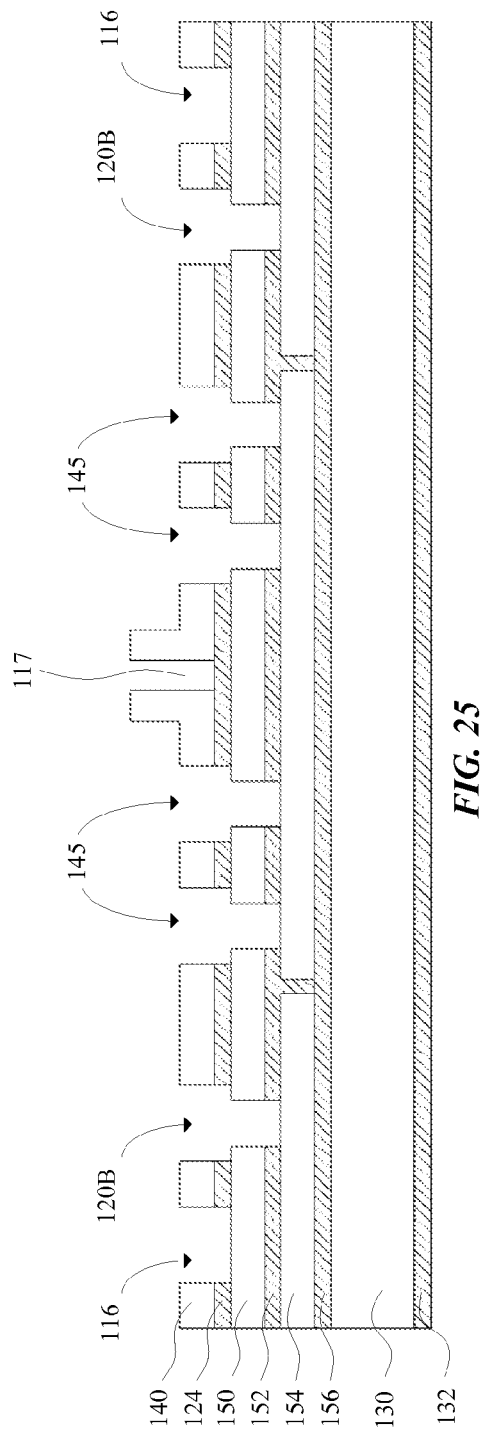
FIG. 24
FIG. 25

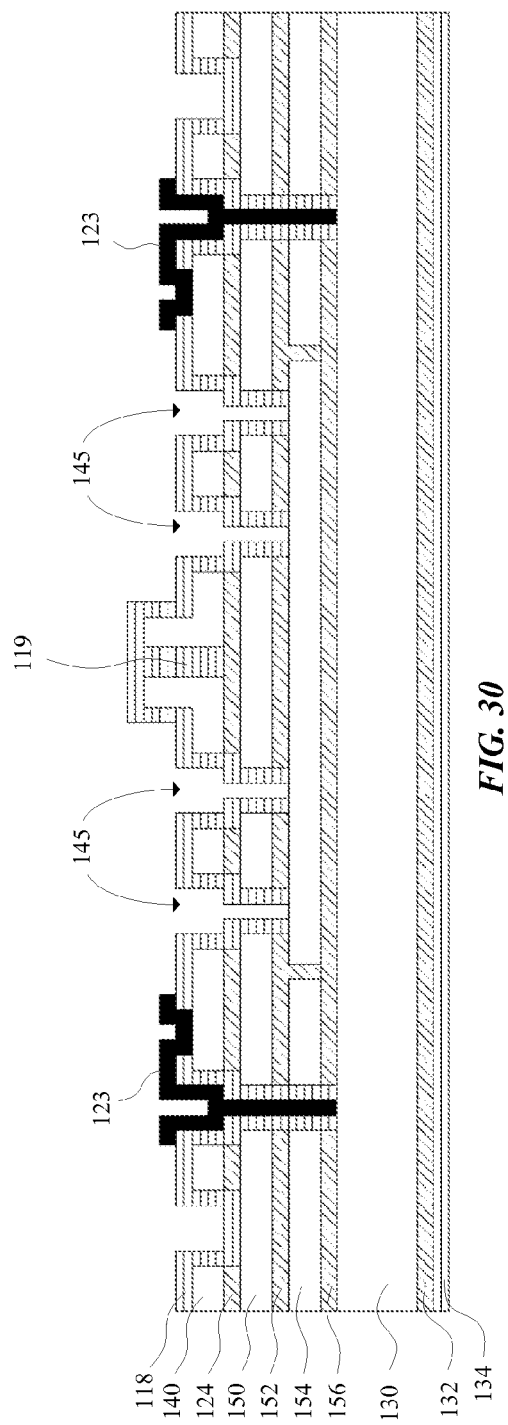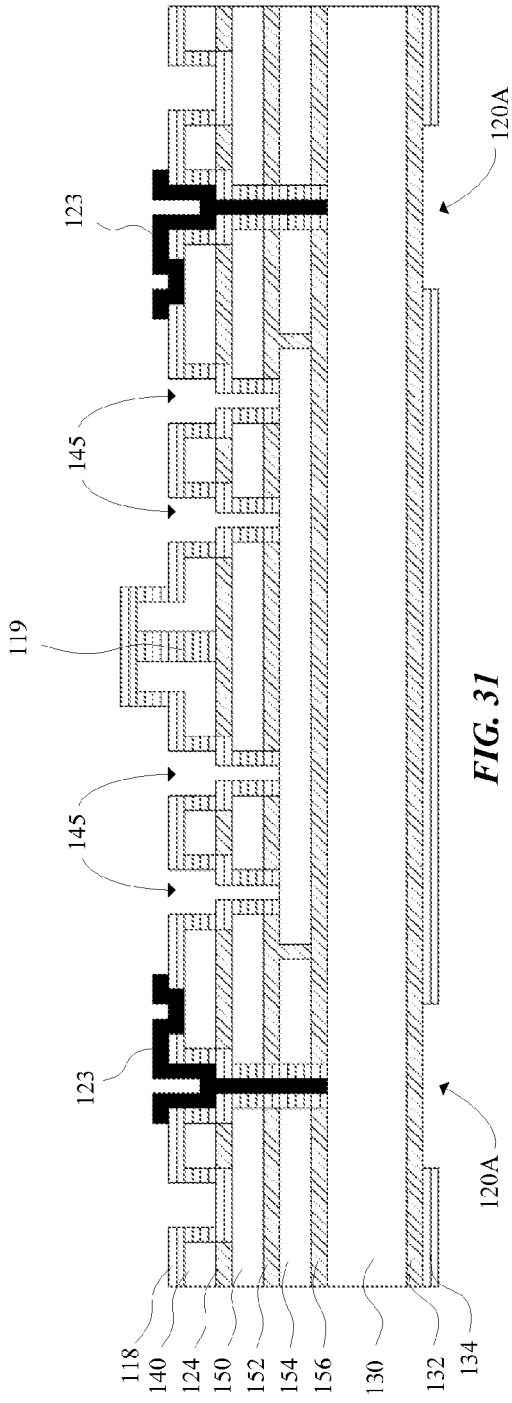

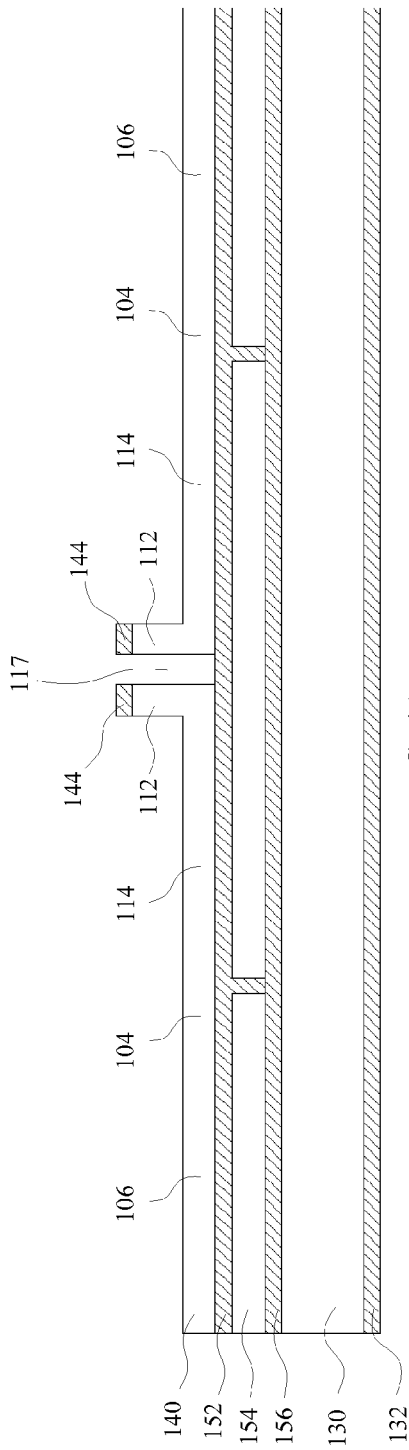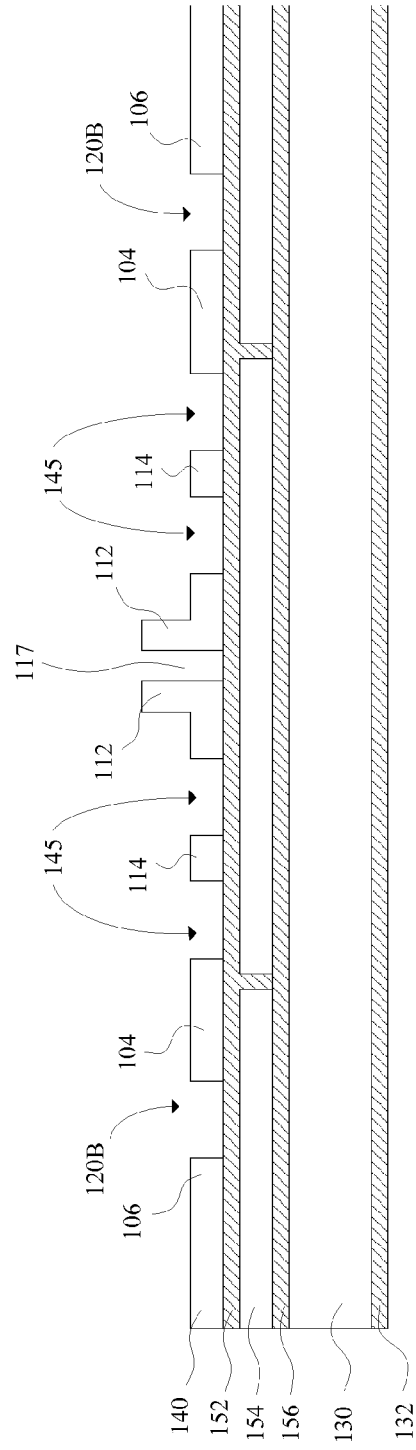

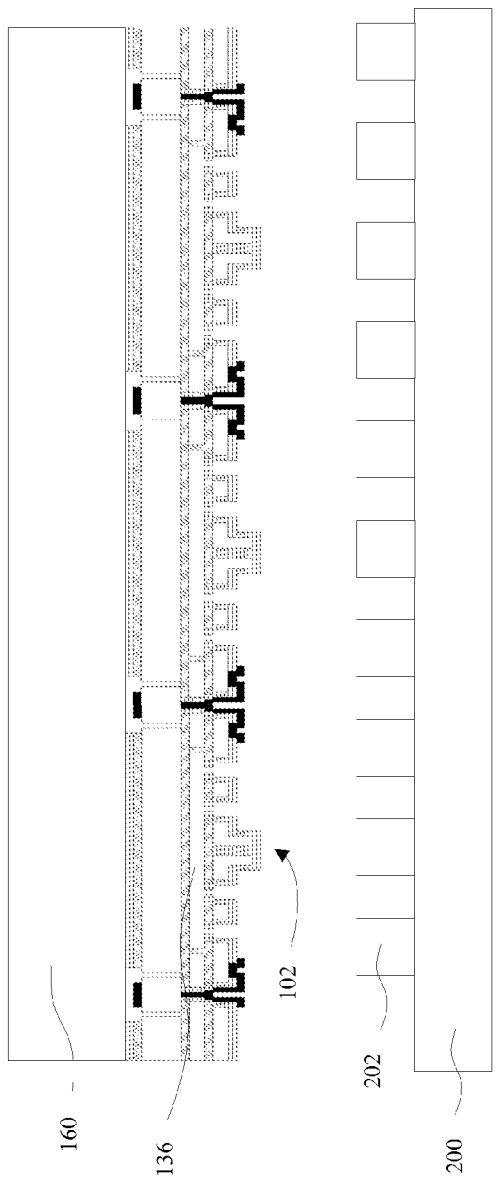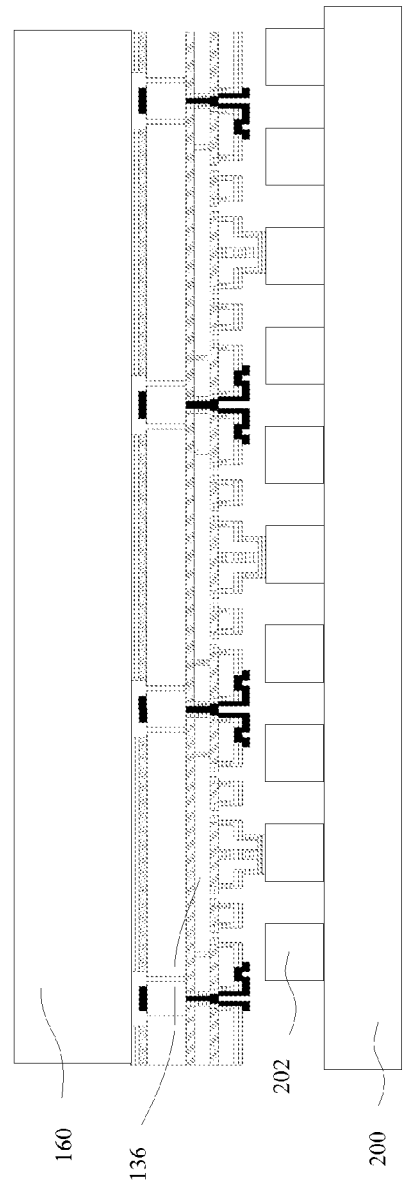

COMPLIANT ELECTROSTATIC TRANSFER HEAD WITH DEFINED CAVITY

BACKGROUND

Field

Embodiment described herein relate to micro devices. More particularly embodiments relate to a compliant electrostatic transfer head array and a method of transferring micro devices to a receiving substrate.

Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators. Traditional technologies for transferring of devices include transfer by wafer bonding from a transfer wafer to a receiving wafer. Such implementations include "direct printing" and "transfer printing" involving wafer bonding/de-bonding steps in which a transfer wafer is de-bonded from a device after bonding the device to the receiving wafer. In addition, the entire transfer wafer with the array of devices is involved in the transfer process.

Other technologies for transferring of devices include transfer printing with elastomeric stamps. In one such implementation an array of elastomeric stamps matching the pitch of devices on a source wafer are brought into intimate contact with the surface of the devices on the source wafer and bonded with van der Walls interaction. The array of devices can then be picked up from the source wafer, transferred to a receiving substrate, and released onto the receiving substrate.

In another implementation, the technology for transferring of devices is enabled by an array of electrostatic transfer heads as described in U.S. Pat. No. 8,415,767. As described, an array of electrostatic transfer heads may be formed from a silicon-on-insulator (SOI) substrate. Furthermore, the array of electrostatic transfer heads may be made compliant such that each silicon electrode is deflectable into a cavity between a base silicon substrate and the silicon electrode. In this manner, each compliant electrostatic transfer head can compensate for variations in height of the devices during the transfer process.

SUMMARY

A compliant electrostatic transfer head, method of forming a compliant electrostatic transfer head, and a method of transferring one or more micro devices to a receiving substrate are described. For example, the receiving substrate may be, but is not limited to, a display substrate, a lighting substrate, a substrate with functional devices such as transistors or integrated circuits (ICs), or a substrate with metal redistribution lines. In an embodiment, a compliant electrostatic transfer head includes a base substrate, a cavity template layer on the base substrate, a first confinement layer between the base substrate and the cavity template layer, and a patterned device layer on the cavity template layer. The patterned device layer includes an electrode that is deflectable toward a cavity in the cavity template layer. In an embodiment, a second confinement layer is between the cavity template layer and the patterned device layer. The second confinement layer may span along a top surface of the cavity template layer and directly above the cavity. The second confinement layer may additionally span along sidewalls of the patterned device layer. In an embodiment, the cavity includes substantially vertical sidewalls.

The second confinement layer may be formed directly on the cavity template layer. A spring support layer may optionally be located between the cavity template layer and the patterned device layer for structural support. In such a configuration, an insulating layer may be provided between the spring support layer and the patterned device layer to electrically insulate the patterned device layer from the spring support layer.

In some embodiments the compliant electrostatic transfer head includes a bipolar electrode configuration. For example, the patterned device layer may include a pair of electrodes that is deflectable toward the cavity in the cavity template layer. The pair of electrodes may include a first electrode lead integrally formed with a first mesa structure protruding above the first electrode lead, and a second electrode lead integrally formed with a second mesa structure protruding above the second electrode lead. The patterned device layer may additionally include a first trace interconnect integrally formed with the first electrode and a second trace interconnect integrally formed with the second electrode.

The compliant electrostatic transfer head may have a variety of electrode beam profiles. For example, the first and second electrodes may form an electrode beam profile extending between the first and second trance interconnects. In an embodiment, each of the first and second electrodes includes a double bend, which may be in an S-shape configuration. In an embodiment, the first and second mesa structures are separated by a trench characterized by a width of 1.0 µm or less, and the trench is filled with a dielectric material.

In an embodiment, a method of forming a compliant electrostatic transfer head includes patterning a device layer to include an electrode beam provide above a patterned cavity template layer, and etching a cavity in the patterned cavity template layer beneath the electrode beam profile to expose a first confinement layer beneath the patterned cavity template layer, with the first confinement layer functioning as an etch stop layer during etching the cavity. Patterning the device layer may include forming a pair of electrodes, each including an electrode lead and a mesa structure. A second confinement layer may additionally span along a top surface and sidewalls of the cavity template layer between the patterned device layer and the patterned cavity template layer. In an embodiment, the second confinement layer is etched to expose the patterned cavity template layer prior to etching the cavity, and the second confinement layer also functions as an etch stop layer during etching the cavity.

In an embodiment, prior to patterning the device layer to include the electrode beam profile, a first wafer stack including the device layer is bonded to a second wafer stack including the patterned cavity template layer, the first confinement layer, and the second confinement layer. For example, bonding may be accomplished by fusion bonding.

BRIEF DESCRIPTION OF THE DRAWINGS

FIG. 2 is a plan view illustration and cross-sectional side view illustration taken along line A-A of a bipolar compliant electrostatic transfer head with cantilever beam and continuous joint supported by a spring support layer in accordance with an embodiment.

FIG. 3 is a plan view illustration and cross-sectional side view illustration taken along line A-A of a bipolar compliant electrostatic transfer head with cantilever beam and mesa joint supported by a spring support layer in accordance with an embodiment.

FIG. 4 is a plan view illustration and cross-sectional side view illustration taken along line A-A of a bipolar compliant electrostatic transfer head with double sided clamped beam and continuous joint supported by a spring support layer in accordance with an embodiment.

FIG. 5 is a plan view illustration and cross-sectional side view illustration taken along line A-A of a bipolar compliant electrostatic transfer head with a double sided clamped beam including a pair of silicon electrodes with double bends and a mesa joint supported by a spring support layer in accordance with an embodiment.

FIG. 6 is a plan view illustration and cross-sectional side view illustration taken along line A-A of a bipolar compliant electrostatic transfer head with a double sided clamped beam including a pair of silicon electrodes with single bends and a mesa joint supported by a spring support layer in accordance with an embodiment.

FIG. 7 is a plan view illustration and cross-sectional side view illustration taken along line A-A of a bipolar compliant electrostatic transfer head with a double sided clamped beam including a pair of silicon electrodes with double bends and a mesa joint in accordance with an embodiment.

FIG. 8 is a plan view illustration and cross-sectional side view illustration taken along line A-A of a bipolar compliant electrostatic transfer head with a double sided clamped supported beam and pair of silicon electrodes supported by a spring support layer in accordance with an embodiment.

FIGS. 10-12 are cross-sectional side view illustrations of a method of forming a base substrate with defined cavities in accordance with an embodiment.

FIGS. 15-35 are cross-sectional side view illustrations of a method patterning the bonded structure of FIG. 14 to form a bipolar compliant electrostatic transfer head array with defined cavities in accordance with an embodiment.

FIGS. 39-53 are cross-sectional side view illustrations of a method patterning the bonded structure of FIG. 38 to form a bipolar compliant electrostatic transfer head array with defined cavities in accordance with an embodiment.

FIG. 55 is a cross-sectional side view illustration of an array of bipolar compliant electrostatic transfer heads positioned over an array of micro devices on a carrier substrate in accordance with an embodiment.

FIG. 56 is a cross-sectional side view illustration of an array of bipolar compliant electrostatic transfer heads in contact with an array of micro devices in accordance with an embodiment.

DETAILED DESCRIPTION

Figure 1A:
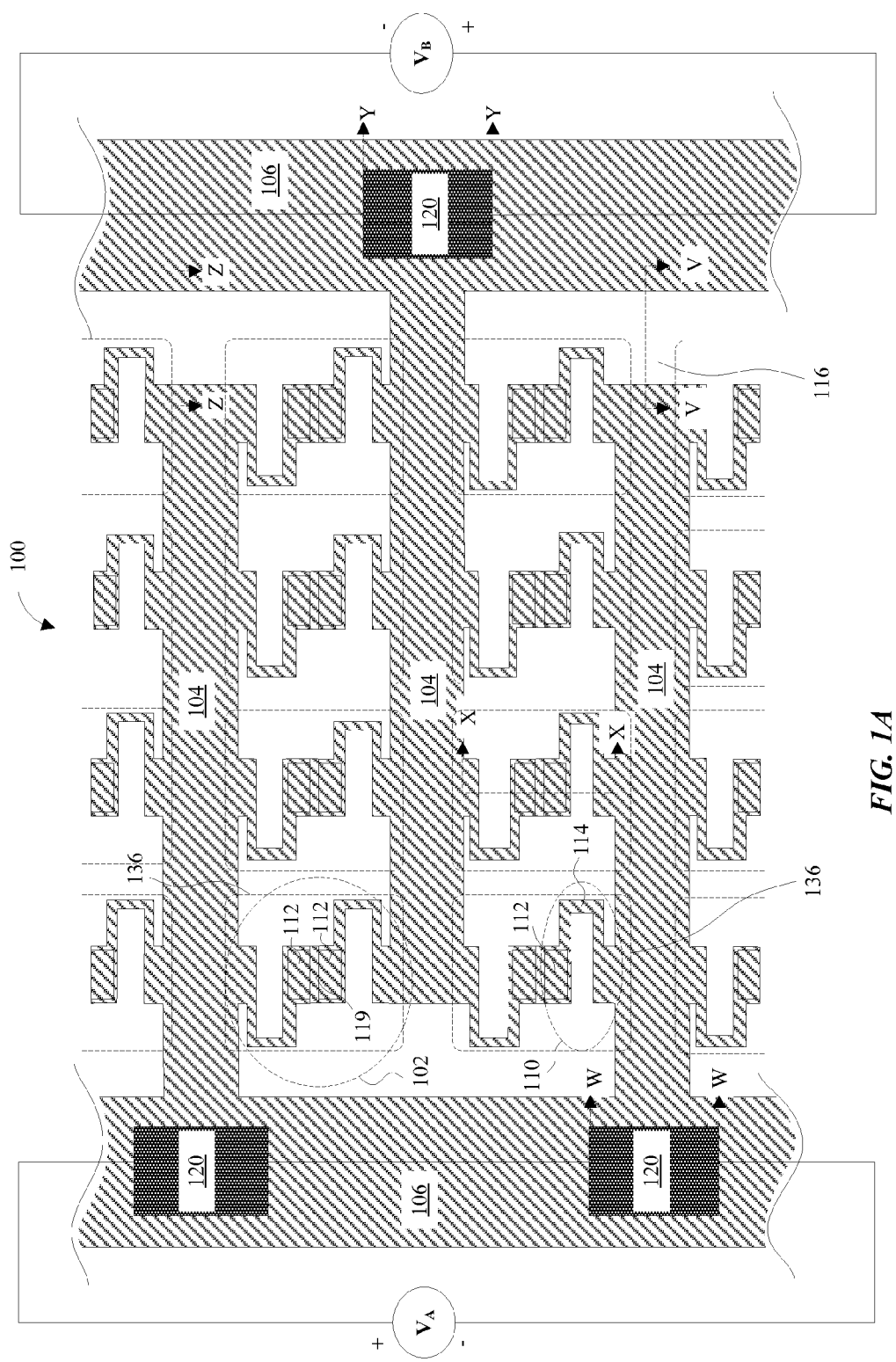
FIG. 1A is a plan view illustration of a micro pick up array including an array of bipolar compliant electrostatic transfer heads in accordance with an embodiment.

Embodiments describe micro pick up arrays and compliant electrostatic transfer heads with defined cavities, and methods of transferring micro devices to a receiving substrate. Without being limited to a particular theory, embodiments describe micro pick up arrays and compliant electrostatic transfer heads which operate in accordance with principles of electrostatic grippers, using the attraction of opposite charges to pick up micro devices. In accordance with embodiments, a pull-in voltage is applied to an electrostatic transfer head in order to generate a grip pressure on a micro device and pick up the micro device. For example, the electrostatic transfer head may include a bipolar electrode configuration. The compliant electrostatic transfer head and head arrays in accordance with embodiments may be used to transfer micro devices such as, but not limited to, diodes, LEDs, transistors, MEMS, silicon integrated circuits (ICs) for logic or memory, and gallium arsenide (GaAs) circuits for radio frequency (RF) communications from a carrier substrate to a receiving substrate such as, but is not limited to, a display substrate, a lighting substrate, a substrate with functional devices such as transistors or ICs, or a substrate with metal redistribution lines.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment," "an embodiment" or the like means that a particular feature, structure, configuration, or characteristic described in connection with the embodiment is included in at least one embodiment. Thus, the appearances of the phrase "in one embodiment," "an embodiment" or the like in various places throughout this specification are not necessarily referring to the same embodiment. Furthermore, the particular features, structures, configurations, or characteristics may be combined in any suitable manner in one or more embodiments.

The terms "over", "to", "spanning", "between" and "on" as used herein may refer to a relative position of one layer with respect to other layers. One layer "over", "spanning" or "on" another layer or bonded "to" another layer may be directly in contact with the other layer or may have one or more intervening layers. One layer "between" layers may be directly in contact with the layers or may have one or more intervening layers.

In one aspect, embodiments describe a micro pick up array including an array of compliant electrostatic transfer heads, and method of operation in which the array of compliant electrostatic transfer heads enables improved contact with an array of micro devices as compared to an array of non-compliant transfer heads. In application, as a micro pick up array is lowered onto an array of micro devices, each compliant electrostatic transfer head is independently deflectable toward a cavity. In this manner, each compliant electrostatic transfer head can compensate for variations in height of the micro devices, impurities (e.g. particles) on the micro devices, or surface profile variations of the carrier substrate such as surface waviness. Such compensation can result in reduced compressive forces applied to certain micro devices, leading to protection of the physical integrity of the micro devices and transfer head array. Such compensation can also assist each compliant electrostatic transfer head to make contact with each micro device, and ensure that each intended micro device is picked up. Without the compliant nature of the compliant electrostatic transfer heads an irregular micro device height, wavy carrier substrate, or a particle on a top surface of a single micro device could prevent the remainder of the transfer heads from making contact with the remainder of the micro devices in the array. As a result, an air gap could be formed between those transfer heads and micro devices. With such an air gap, it is possible that the target applied voltage would not create a sufficient grip pressure to overcome the air gap, resulting in an incomplete pick-up process.

In one aspect, embodiments describe compliant electrostatic transfer heads with predefined cavity dimensions (depth, length, width) in which the cavity dimensions are precisely and uniformly determined by the location of confinement layers. In an embodiment, a compliant electrostatic transfer head includes a base substrate, a cavity template layer on the base substrate, a first confinement layer between the base substrate and the cavity template layer, and a patterned device layer on the cavity template layer. The patterned device layer includes an electrode and electrode beam profile that are deflectable toward a cavity in the cavity template layer. A second confinement layer may additionally be located between the cavity template layer and the patterned device layer. In an embodiment, the second confinement layer spans along a top surface of the cavity template layer and directly above the cavity. The second confinement layer may additionally span along sidewalls of the cavity template layer. In an embodiment, the portion of the second confinement layer along sidewalls of the cavity template layer defines, and corresponds to the cavity sidewalls, while the first confinement layer corresponds to a bottom surface of the cavities. In an embodiment, the first and second confinement layers are formed of a dielectric material, such as SiO2. In an embodiment, the cavity template layer is formed of a material, such as silicon, that can be selectively etched relative to the first and second confinement layers.

In another aspect, embodiments describe a manner of fabricating a micro pick up array in which predefined cavity dimensions (depth, length, width) are fabricated at an initial stage, prior to formation of the electrode beam profiles. In an embodiment, a device layer is patterned to include an electrode beam profile above a patterned cavity template layer, and a cavity is then etched in the patterned cavity template layer using one or more confinement layers as etch stop layers. Prior to the etching the cavities, the first and second confinement layers may encapsulate a portion of the cavity template layer, which serves a sacrificial cavity fill material. In an embodiment, selective etch removal of the sacrificial cavity fill material to the first and second confinement layers enables controlled, uniform etching of the cavities. In this manner, the dimensions of the cavities toward which the electrodes and electrode beam profiles deflect may be precisely controlled by the confinement layers, and etch release of the electrode beam profiles can be performed at a terminal stage in the fabrication process, thereby preserving the structural and electrical integrity of the electrodes. Additionally, this may ensure a uniform profile of the array of cavities.

In another aspect, embodiments describe a manner of forming an array of compliant electrostatic transfer heads from commercially available silicon and silicon-on-insulator (SOI) substrates. In an embodiment, defined cavity dimensions are formed in a cavity template layer at an initial fabrication stage prior to bonding an SOI substrate stack to the cavity template layer.

The terms "micro" device or "micro" LED structure as used herein may refer to the descriptive size of certain devices or structures in accordance with embodiments. As used herein, the terms "micro" devices or structures are meant to refer to the scale of 1 to 300 μm, for example, each micro device or electrostatic transfer head including a maximum length or width of a contact surface or mesa structure of 1 to 300 μm. For example, each electrostatic transfer head may include a pair of silicon electrodes, with each silicon electrode including a mesa structure with a maximum width or length of 1 to 300 μm, 1 to 100 μm, or more specifically 1 to 10 μm. In an exemplary embodiment, an electrostatic transfer head has a contact surface of approximately 10 μm by 10 μm. In an embodiment, a bipolar electrostatic transfer head includes a pair of mesa structure of approximately 4.5 μm (width) by 10 μm (length) separated by a 1 μm gap. In another exemplary embodiment, a bipolar electrostatic transfer head having a contact surface of approximately 5 μm by 5 μm includes a pair of mesa structure of approximately 2.25 μm (width) by 5 μm (length) separated by a 0.5 μm gap. However, it is to be appreciated that embodiments are not necessarily so limited, and that certain aspects of the embodiments may be applicable to larger, and possibly smaller size scales.

In some exemplary embodiments, arrays of micro devices which are poised for pick up are described as having a size of 10 μm (in x and/or y dimensions), or size of 5 μm (in x and/or y dimensions). However, it is to be appreciated that embodiments are not necessarily so limited, and that certain aspects of the embodiments may be applicable to larger, and possibly smaller size scales as described above with regard to the electrostatic transfer heads. A transfer tool including an array of compliant electrostatic transfer heads matching an integer multiple of a pitch of the corresponding array of micro devices on a carrier substrate can be used to pick up and transfer the array of micro devices to a receiving substrate. In this manner, it is possible to integrate and assemble micro devices into heterogeneously integrated systems, including substrates of any size ranging from micro displays to large area displays, and at high transfer rates. For example, a 1 cm by 1 cm array of compliant electrostatic transfer heads can pick up and transfer more than 100,000 micro devices, with larger arrays of compliant electrostatic transfer heads being capable of transferring more micro devices.

Referring now to FIG. 1A, a plan view illustration is provided, with views at different depths, for a micro pick up array including an array of bipolar compliant electrostatic transfer heads. In the particular embodiment illustrated, the shaded area illustrates an arrangement of silicon electrodes and silicon interconnects as viewed from the top surface of the bipolar compliant electrostatic transfer head array. The darker shading illustrates a top side via connection as viewed from the top side surface of the bipolar compliant electrostatic transfer head array. Exemplary locations of cavities 136 are illustrated as dotted lines underneath the silicon electrodes. In this manner, the plan view illustration provides detail regarding structures at various depths from a top side of the SOI wafer stack. It is to be appreciated that while FIG. 1A illustrates a bipolar electrode configuration, that embodiments are not limited to bipolar electrode configurations, and embodiments are also applicable to other electrode configurations including monopolar electrode configurations or electrode configurations including more than two electrodes.

As illustrated, the micro pick up array 100 includes an array of compliant electrostatic transfer heads 102 connected to an arrangement of silicon trace interconnects 104, and bus interconnects 106. As illustrated, bus interconnects 106 may be formed around a periphery or outside a working area of the micro pick up array including the array of compliant electrostatic transfer heads 102. In an embodiment, each compliant electrostatic transfer head 102 includes a pair of silicon electrodes 110, with each silicon electrode 110 including a mesa structure 112 and an electrode lead 114 connected to a silicon interconnect 104. As illustrated, each compliant electrostatic transfer head 102 is in the form of a double sided clamped beam profile clamped at opposite sides to silicon trace interconnects 104. As illustrated, a silicon electrode double sided clamped beam may include a pair of silicon electrode leads 114 each with a double bend 115, and pair mesa structures 112 separated by a mesa dielectric joint 119 that extends in a transverse width of the double sided clamped beam parallel to the pair of silicon interconnects 104. In such an embodiment, the dielectric joint 119 electrically insulates the pair of silicon electrodes in the bipolar electrode configuration along a transverse width of the double sided clamped beam between the pair of mesa structures 112. In the particular embodiment illustrated, the beam is in an S-shape configuration, though a variety of other configurations are contemplated. In the embodiment illustrated, the array of mesa structure 112 pairs in the micro pick up array 100 are arranged with approximately the same pitch as the micro devices to be picked up, and placed, for example, corresponding to a pixel pitch on a display substrate for exemplary micro LED devices.

In an embodiment, a plurality of vias 120 are formed through the micro pick up array SOI stack to provide a backside electrical contact to interconnects 106 in order to electrically connect the silicon electrodes 110 with working circuitry of a transfer head assembly. In the embodiment illustrated in FIG. 1A, the interconnect 106 on the left side of the illustration may be connected to a first voltage source $V_A$, and the interconnect 106 on the right side of the illustration may be connected to a second voltage source $V_B$.

Where each compliant electrostatic transfer head 102 is operable as a bipolar electrostatic transfer head, voltage sources $V_A$ and $V_B$ may simultaneously apply opposite voltages so that each of the silicon electrodes 110 in a respective compliant electrostatic transfer head 102 has an opposite voltage.

Figure 1B:
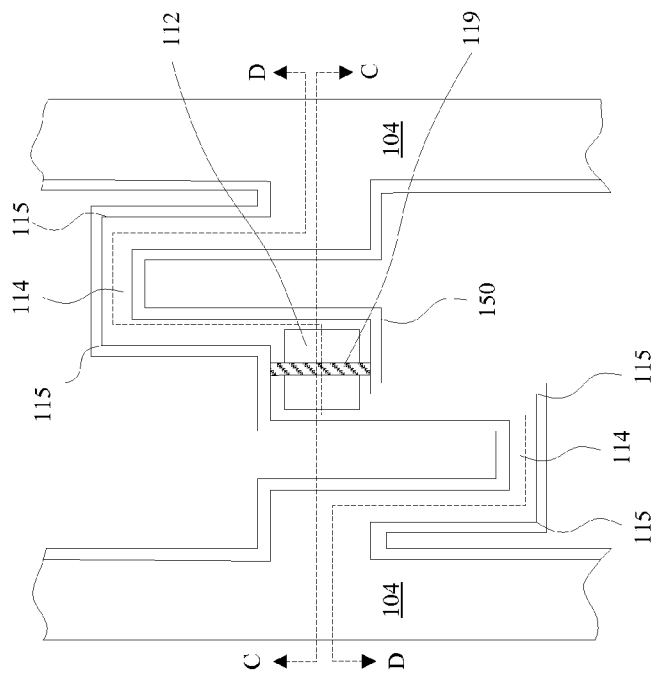
FIG. 1B is a plan view illustration of a bipolar compliant electrostatic transfer head with a double sided clamped beam including a pair of silicon electrodes with double bends and a mesa joint supported by a spring support layer in accordance with an embodiment.

FIG. 1B is a close-up plan view illustration of a single bipolar compliant electrostatic transfer head 102 of FIG. 1A. As illustrated, the double sided clamped beam includes a pair of silicon electrode leads 114 with double bends 115 and a mesa joint 119 between mesa structures 112, all of which may be optionally supported by a spring support layer 150. For example, the description made with regard to FIGS. 13-35 is made with regard to a double SOI stacked wafer including spring support layer 150, while the description made with regard to FIGS. 37-53 is made with regard to an SOI stacked wafer that does not include spring support layer. Accordingly, illustration of spring support layer 150 in FIGS. 1B-8 is optional.

Referring again to FIG. 1B, the silicon electrodes form an electrode beam profile, and the optional spring support layer 150 forms a spring support layer beam profile underneath and supporting the electrode beam profile, where the spring support layer beam profile is wider than the supported electrode beam profile. A cavity 136 is formed within the cavity template layer 154 and the electrode beam profile and spring support layer beam profile are deflectable toward the cavity 136. In an embodiment, a separate cavity 136 is formed underneath each compliant electrostatic transfer head 102. In an embodiment, a single cavity 136 spans underneath multiple compliant electrostatic transfer heads 102.

Figure 1D:
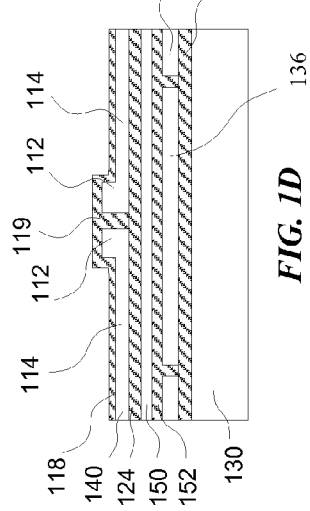
FIG. 1D is a cross-sectional side view illustration taken along longitudinal line D-D of the bipolar compliant electrostatic transfer head illustrated in FIG. 1B in accordance with an embodiment.
Figure 1C:
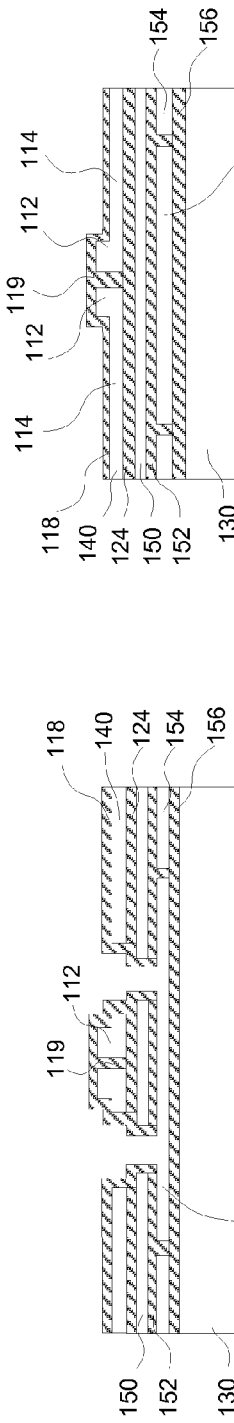
FIG. 1C is a cross-sectional side view illustration taken along transverse line C-C of the bipolar compliant electrostatic transfer head illustrated in FIG. 1B in accordance with an embodiment.

FIG. 1C is a cross-sectional side view illustration taken along transverse line C-C of the bipolar compliant electrostatic transfer head illustrated in FIG. 1B in accordance with an embodiment. In the embodiment illustrated in FIG. 1C, each silicon electrode 110 in a bipolar electrode configuration extends from a separate silicon interconnect 104. FIG. 1D is a cross-sectional side view illustration taken along longitudinal line D-D of the bipolar compliant electrostatic transfer head illustrated in FIG. 1B in accordance with an embodiment. As illustrated in FIGS. 1C-1D, both the silicon electrode mesa structures 112 and leads 114 extend over and are deflectable toward a cavity 136 between the base substrate 130 and the silicon electrode 110.

As illustrated in FIGS. 1C-1D, a first confinement layer 156 is located between the base substrate 130 and cavity template layer 154. A second confinement layer 152 may be formed between the cavity template layer 154 and patterned device layer 140. In the embodiment illustrated, second confinement layer 152 is located between the cavity template layer 154 and optional spring support layer 150. As shown, the second confinement layer 152 spans along a top surface of the cavity template layer 154 and directly above the cavity 136. The second confinement layer 152 may additionally span along sidewalls of the cavity template layer 152, defining sidewalls of the cavity 136. Alternatively, separate confinement layers can be used along the top surface and sidewalls of the cavity template layer 154.

In an embodiment, a separate cavity 136 is formed underneath each bipolar silicon electrode 110 in the micro pick up array and between two separate silicon interconnects 104. In an embodiment, a single cavity 136 is formed underneath an array of bipolar silicon electrodes 110 and between two separate silicon interconnects 104. Referring again to FIG. 1A, a single or multiple separate cavities 136 can be formed between arrays of silicon interconnects 104.

In an embodiment, cavities 136 are the same cavity. Trenches 116 may also be formed in the patterned silicon layer defining the silicon electrodes 110 and silicon interconnects 104, 106 as described in more detail in the following description.

FIGS. 2-8 illustrate various modifications of bipolar compliant electrostatic transfer heads spanning between silicon interconnects 104 in accordance with embodiments. While FIGS. 2-8 are illustrated separately from the detailed processing sequences illustrated in FIGS. 10-35 and FIGS. 37-53, it is to be appreciated that many of the various modifications described with respect to FIGS. 2-8 can be implemented into the processing sequences. Similar to FIG. 1A, for clarity purposes, only a single bipolar compliant electrostatic transfer head 102 is illustrated in FIGS. 2-8 as spanning between two silicon trance interconnects 104, though an array of bipolar electrostatic transfer heads may span between the silicon interconnects 104 in accordance with embodiments. Also, similar to the single bipolar compliant electrostatic transfer head described with regard to FIGS. 1B-1D, FIGS. 2-8 each illustrate an electrode beam profile, optional spring support layer beam profile, and defined cavity 136.

FIG. 2 is a plan view illustration and cross-sectional side view illustration taken along line A-A of a bipolar compliant electrostatic transfer head with cantilever beam and continuous joint in accordance with an embodiment. As illustrated, a silicon electrode cantilever beam may include a pair of silicon electrode leads 114 extending from two silicon interconnects 104, and pair mesa structures 112 separated by a continuous dielectric joint 119 which extends in a longitudinal length of the cantilever beam parallel to the pair of silicon interconnects 104, all optionally supported by a spring support layer 150. In such an embodiment, the dielectric joint 119 electrically insulates the pair of silicon electrodes in the bipolar electrode configuration along a longitudinal length of the cantilever beam along both the pair silicon electrode leads 114 and pair of mesa structures 112. As illustrated, the silicon electrode leads 114 may include a bend 115 (illustrated as a 90 degree bend).

FIG. 3 is a plan view illustration and cross-sectional side view illustration taken along line A-A of a bipolar compliant electrostatic transfer head with cantilever beam and mesa joint in accordance with an embodiment. As illustrated, a silicon electrode cantilever beam may include a pair of silicon electrode leads 114 extending from two silicon interconnects 104, and pair mesa structures 112 separated by a mesa dielectric joint 119 which extends in a longitudinal length of the cantilever beam parallel to the pair of silicon interconnects 104, all optionally supported by a spring support layer 150. In such an embodiment, the dielectric joint 119 electrically insulates the pair of silicon electrodes in the bipolar electrode configuration along a longitudinal length of the cantilever beam along the pair of mesa structures 112. As illustrated, the pair of silicon electrode leads 114 are physically separated by patterning and may include a bend 115 (illustrated as a 90 degree bend).

FIG. 4 is a plan view illustration and cross-sectional side view illustration taken along line A-A of a bipolar compliant electrostatic transfer head with double sided clamped beam and continuous joint in accordance with an embodiment. As illustrated, a silicon electrode double sided clamped beam may include a pair of bent silicon electrode leads 114 extending from two silicon interconnects 104, and pair mesa structures 112 separated by a continuous dielectric joint 119 which extends in a longitudinal length of the cantilever beam parallel to the pair of silicon interconnects 104, all optionally supported by a spring support layer 150. In such an embodiment, the dielectric joint 119 electrically insulates the pair of silicon electrodes in the bipolar electrode configuration along a longitudinal length of the double sided clamped beam along both the pair silicon electrode leads 114 and pair of mesa structures 112. As illustrated, the silicon electrode leads 114 may each include bends 115 (illustrated as 90 degree bends) at proximal and distal locations where the electrode leads extend from the silicon interconnects 104.

FIG. 5 is a plan view illustration and cross-sectional side view illustration taken along line A-A of a bipolar compliant electrostatic transfer head with a double sided clamped beam including a pair of silicon electrodes with double bends and a mesa joint in accordance with an embodiment. As illustrated, a silicon electrode double sided clamped beam may include a pair of silicon electrode leads 114 extending from two silicon interconnects 104, each lead 114 with a double bend 115, and pair mesa structures 112 separated by a mesa dielectric joint 119 which extends in a transverse width of the double sided clamped beam parallel to the pair of silicon interconnects 104, all optionally supported by a spring support layer 150. In such an embodiment, the dielectric joint 119 electrically insulates the pair of silicon electrodes in the bipolar electrode configuration along a transverse width of the cantilever beam between the pair of mesa structures 112, and the pair of silicon electrode leads 114 are physically separated by patterning. In the embodiment illustrated, each electrode lead 114 is split, so that the beam configuration assumes an 8-shape configuration with the silicon electrode leads 114.

FIG. 6 is a plan view illustration and cross-sectional side view illustration taken along line A-A of a bipolar compliant electrostatic transfer head with a double sided clamped beam including a pair of silicon electrodes with single bends and a mesa joint in accordance with an embodiment. As illustrated, a silicon electrode double sided clamped beam may include a pair of silicon electrode leads 114 extending from two silicon interconnects 104, each lead 114 with a single bend 115, and pair mesa structures 112 separated by a mesa dielectric joint 119 extends in a transverse width of the double sided clamped beam perpendicular to the pair of silicon interconnects 104, all optionally supported by a spring support layer 150. In such an embodiment, the dielectric joint 119 electrically insulates the pair of silicon electrodes in the bipolar electrode configuration along a transverse width of the double sided clamped beam between the pair of mesa structures 112, and the pair of silicon electrode leads 114 are physically separated by patterning.

FIG. 7 is a plan view illustration and cross-sectional side view illustration taken along line A-A of a bipolar compliant electrostatic transfer head with a double sided clamped beam including a pair of silicon electrodes with double bends and a mesa joint in accordance with an embodiment. As illustrated, a silicon electrode double sided clamped beam may include a pair of silicon electrode leads 114 each with a double bend 115, and pair mesa structures 112 separated by a mesa dielectric joint 119 which extends in a transverse width of the double sided clamped beam parallel to the pair of silicon interconnects 104, all optionally supported by a spring support layer 150. In such an embodiment, the dielectric joint 119 electrically insulates the pair of silicon electrodes in the bipolar electrode configuration along a transverse width of the double sided clamped beam between the pair of mesa structures 112. In the particular embodiment illustrated in FIG. 7, the beam is in a W-shape configuration.

FIG. 8 is a plan view illustration and cross-sectional side view illustration taken along line A-A of a bipolar compliant electrostatic transfer head with a double sided clamped beam including a pair of silicon electrodes and a mesa joint in accordance with an embodiment. As illustrated, a silicon electrode double sided clamped beam may include a pair of silicon electrode leads 114 and a pair mesa structures 112 separated by a mesa dielectric joint 119 which extends in a transverse width of the double sided clamped beam parallel to the pair of silicon interconnects 104, all optionally supported by a spring support layer 150. In such an embodiment, the dielectric joint 119 electrically insulates the pair of silicon electrodes in the bipolar electrode configuration along a transverse width of the double sided clamped beam between the pair of mesa structures 112.

Figure 9:
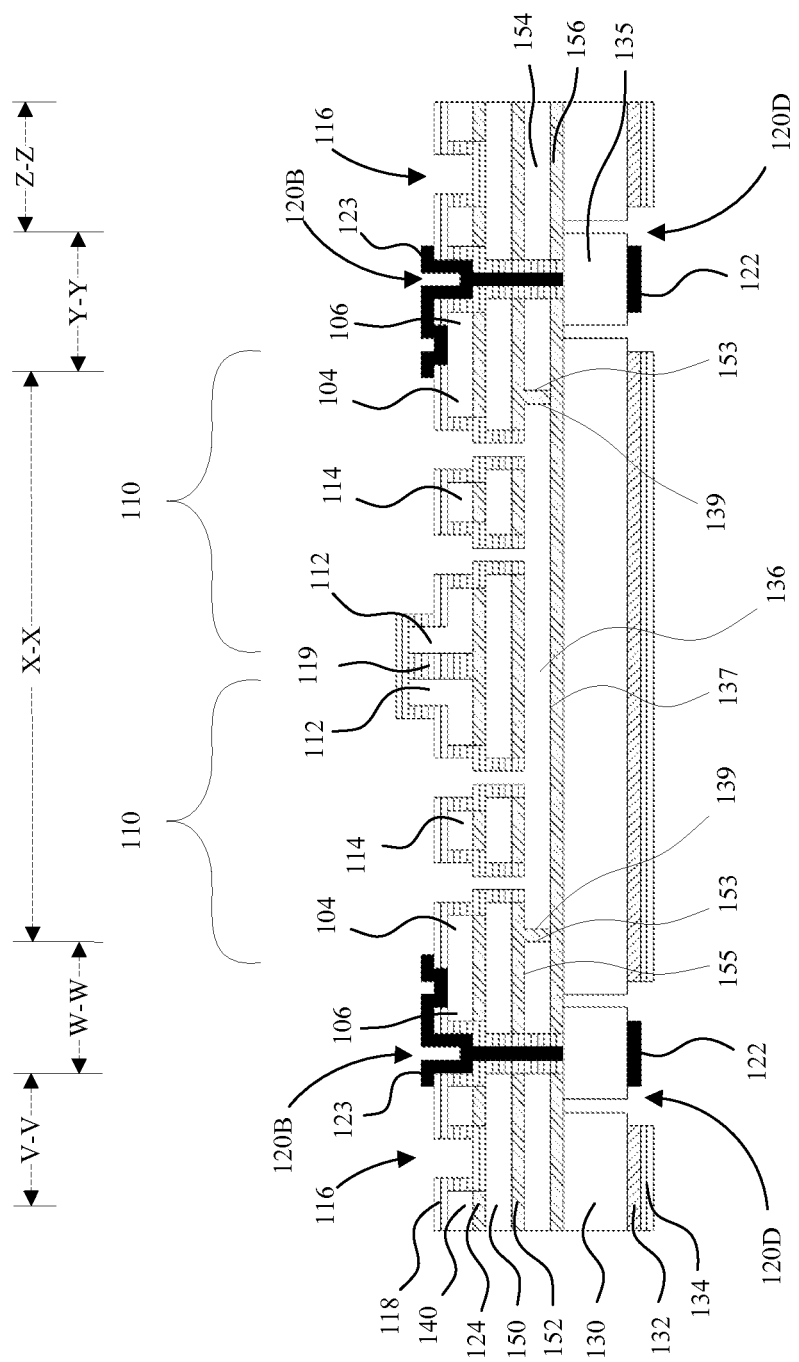
FIG. 9 is a combination cross-sectional side view illustration taken along lines V-V, W-W, X-X, Y-Y, and Z-Z from FIG. 1A in accordance with an embodiment.

Referring now to FIG. 9 a combination cross-sectional side view illustration is provided taken along lines V-V, W-W, X-X, Y-Y, and Z-Z from FIG. 1A in accordance with an embodiment. The combination view is not a representation of the precise relative locations for all of the different features illustrated, rather the combination view combines specific features at different locations previously identified in FIG. 1A in order to more easily represent the particular variations in processing sequences. For example, while the combination cross-sectional side view illustration shows one via 120 corresponding to one silicon electrode 110, it is clear from FIG. 1A that one via 120 may be electrically connected with a plurality of silicon electrodes 110 along one or more interconnects 104. As illustrated, lines W-W and Y-Y are along vias 120. As illustrated, lines V-V and Z-Z are along one or more trenches 116 defining the silicon electrodes 110 and silicon interconnects 104, 106. As illustrated, line X-X is across a bipolar compliant electrostatic transfer head including a pair of silicon electrodes 110. Referring again to FIG. 1A, one or more cavities 136 may be formed around and beneath all silicon electrodes 110, and between interconnects 104, 106.

A silicon electrode 110 includes a mesa structure 112 and an electrode lead 114, where the mesa structure 112 is an elevated portion of the silicon electrode 110. In an embodiment, the mesa structures 112 may be separated by a trench with a width of 1 µm or less. A dielectric layer 118 may cover a top and side surfaces of the pair of silicon electrodes 110 and interconnects 104, 106. The dielectric layer 118 may also cover a side surface of the mesa structures 112 within the trench laterally between the pair of mesa structure 112 for the pair of silicon electrodes 110 in a bipolar compliant electrostatic transfer head 102. As illustrated, the dielectric layer 118 may form a dielectric joint 119 that fills the trench laterally between the pair of mesa structures 112. Since the dielectric joint 119 connects the silicon electrodes 110, the bipolar electrode assembly illustrated in FIG. 9 is characterized as a beam structure spanning between silicon interconnects, in which the joined beam structure is deflectable toward cavity 136.

The bipolar compliant electrostatic transfer head includes a base substrate 130, a cavity template layer 154 on the base substrate, and a first confinement layer 156 between the base substrate 130 and the cavity template layer 154. A patterned device layer 140 is on the cavity template layer 154 and includes a pair of silicon electrodes 110 that are deflectable toward the cavity 136. Each silicon electrode 110 includes an electrode lead 114 that is integrally formed with a mesa structure 112 that protrudes above the corresponding electrode lead 114. In an embodiment, each mesa structure 112 is approximately 15 µm tall, corresponding to the thickness of device layer 140 after the formation of mesa etch masks 144 described in further detail below, and the electrode leads 114 are approximately 5 µm thick. These dimensions are exemplary, and other dimensions are contemplated.

In the particular embodiment illustrated, an optional spring support layer 150 is formed on the cavity template layer 154, with the patterned device layer 140 on the second confinement layer 152. An insulating layer 124 may additionally be located on the spring support layer 150 to electrically insulate the patterned device layer 140 from the spring support layer 150. The silicon electrodes 110 form an electrode beam profile, and the spring support layer 150 forms a spring support layer beam profile underneath and supporting the electrode beam profile. In an embodiment, the spring support layer beam profile is wider than the supported electrode beam profile. The spring support layer beam profile and supported electrode beam profile may also have the same width. Together, both the spring support layer beam profile and electrode beam profile are deflectable toward the cavity 136.

The cavity 136 may be defined by the first confinement layer 156 and second confinement layer 152, with the first confinement layer 156 forming the bottom surface 137 of the cavity 136 and the second confinement layer 152 forming sidewalls 139 of the cavity 136. Cavity 136 sidewalls 139 may be substantially vertical in an embodiment. The second confinement layer 152 may span along a top surface 155 of the cavity template layer 154 and directly above the cavity 136, and additionally span along sidewalls 153 of the patterned cavity template layer 154.

A via opening 120D may extend through the base substrate 130 from a backside of the base substrate. In the particular embodiment illustrated, via opening 120D terminates at a bottom surface of the first confinement layer 156 and beneath where interconnect 106 is located. A via plug 135 is formed within via opening 120D. With such configuration via plug 135 is electrically isolated from the base substrate 130.

A top side via opening 120B may be formed over the backside via opening 120D. In the embodiment illustrated the top side via opening 120B is filled with top conductive contact 123. In the particular embodiment illustrated, top side via opening 120B is formed through the patterned device layer 140, insulating layer 124, spring support layer 150, second confinement layer 152, cavity template layer 154, and first confinement layer 156 in order for top conductive contact 123 to provide an electrical connection to plug 135. Collectively, openings 120A, 120B, 120C, 120D, conductive contacts 122, 123, and via plug 135 are referred to herein as via 120. In an embodiment, in addition to being formed within top side via openings 120B, top side conductive contact 123 is also formed on an exposed top surface of the silicon interconnect 106. In this manner, partially forming conductive contacts 123 over the top surface of the silicon interconnects 106 can provide greater surface area for ohmic contact with the silicon interconnects 106.

In an embodiment, via plug 135 is formed from the base substrate 130, and provides for an electrical connection with top conductive contact 123. In this manner, a first via plug 135 is electrically coupled to a first bus interconnect 106, and a second via plug 135 is electrically coupled to a second bus interconnect 106. In an embodiment, vias 120 contact one or more bus interconnects 106 in the patterned device layer 140. In other embodiments, vias 120 may contact other features or interconnects in the patterned device layer 140. Via 120 along line W-W may be electrically connected to a first bus interconnect 106 which is connected to a first voltage source $V_A$, and via 120 along line Y-Y may be electrically connected to a second bus interconnect 106 which is connected to a second voltage source $V_B$.

Still referring to FIG. 9, in an embodiment the dielectric layer 118 is formed on top and side surfaces of the patterned device layer 140. The dielectric layer 118 may additionally be formed on side surfaces of the via openings 120B. In this manner, the dielectric layer 118 electrically insulates the top conductive contact 123. In an embodiment, the dielectric layer 118 functions to provide the desired dielectric constant and/or dielectric breakdown strength, and resultant pick-up pressure of the compliant electrostatic transfer head. In an embodiment, dielectric layer 118 is atomic layer deposition (ALD) $SiO_2$, $Al_2O_3$, $Ta_2O_5$, $HfO_2$, $Si_3N_4$, or $RuO_2$.

In another embodiment, an optional second dielectric layer may be formed over dielectric layer 118 to provide the desired capacitance. In such an optional arrangement, dielectric layer 118 can provide alternative or additional functions, such as an etch protection layer. In such an embodiment, dielectric layer 118 is formed of a nitride material. In an embodiment, the second dielectric layer has a higher dielectric constant and/or dielectric breakdown strength than the dielectric layer 118. In an embodiment, dielectric layer 118 is a deposited silicon nitride ($SiN_x$), and second dielectric layer is atomic layer deposition (ALD) $SiO_2$, $Al_2O_3$, $Ta_2O_5$, $HfO_2$, $Si_3N_4$, or $RuO_2$.

FIGS. 10-35 illustrate a method of forming a micro pick up array including an array of bipolar compliant electrostatic transfer heads in accordance with an embodiment. Similar to FIG. 9, FIGS. 10-35 are combination cross-sectional side view illustrations taken along lines V-V, W-W, X-X, Y-Y, and Z-Z from FIG. 1A. Initially, the process may begin with preparing a patterned cavity template layer. FIGS. 10-12 are cross-sectional side view illustrations of a method of forming a patterned cavity template layer in an embodiment. Referring to FIG. 10, formation of the patterned cavity template layer is begins with a silicon on insulator (SOI) substrate. In an embodiment, the SOI substrate may include a 1 μm thick back side passivation layer 132 ($SiO_2$), 400 μm+/−50 μm thick base substrate 130 (silicon), 0.5 μm thick first confinement layer 156 ($SiO_2$), and 5 μm thick cavity template layer 154 (silicon). Base substrate 130 may be formed of any suitable material for providing a supporting structure. Where via plugs 135 are to be formed from the base substrate 130, the base substrate is formed of a material capable of transferring charge, such as a single crystalline, or polycrystalline silicon substrate.

Cavity template layer 154 is then patterned by forming trenches 151 through the cavity template layer 154 stopping on the first confinement layer 156. In an embodiment, a silicon cavity template layer 154 is etched using dry reactive ion etching (DRIE). In an embodiment, trenches 151 have vertical sidewalls 153. In an embodiment, trenches 151 are narrow enough such that they are completely filled using a thermal oxidation process. Though trenches 151 may be wider and it is not required that the trenches 151 be completely filled with a dielectric material. In an embodiment, trenches 151 are approximately 1 μm wide or less, such as 0.5 μm wide. Following the formation of trenches 151, in an embodiment, second confinement layer 152 may be formed within trenches 151 and on a top surface of cavity template layer 154. In an embodiment, second confinement layer 152 thermally grown to a thickness of approximately 0.5 μm. For example, where cavity template layer 154 is formed of silicon, second confinement layer 152 is formed of $SiO_2$. Following the formation of second confinement layer 152, the patterned cavity template layer 154 includes sacrificial portions 154B that are encapsulated by the confinement layers 152, 156 and function as sacrificial cavity fill material during processing. Thus, portions 154B provide structural integrity during the fabrication process of the electrostatic transfer heads, and are selectively etched away at a terminal spring release etch operation.

Thickness of the cavity template layer 154, and hence depth of the cavities to be formed, may be determined such that sufficient room is allowed for deflection of the compliant electrostatic transfer heads toward the cavities. Each bipolar compliant electrostatic transfer head may be deflectable toward a corresponding cavity, or a plurality of bipolar compliant electrostatic transfer heads may be deflectable toward a same cavity. The number, size, and shape of sacrificial portions 154B corresponding to cavities 136 may be dependent upon particular design. For example, in one configuration a sacrificial portion 154B corresponding to a cavity 136 has a width of approximately 10 μm to 50 μm, and a length to support one or more bipolar compliant electrostatic transfer heads. For example, a length of 10 μm to 50 μm may support one bipolar compliant electrostatic transfer heads, with a larger length supporting more bipolar compliant electrostatic transfer heads.

Figure 13:
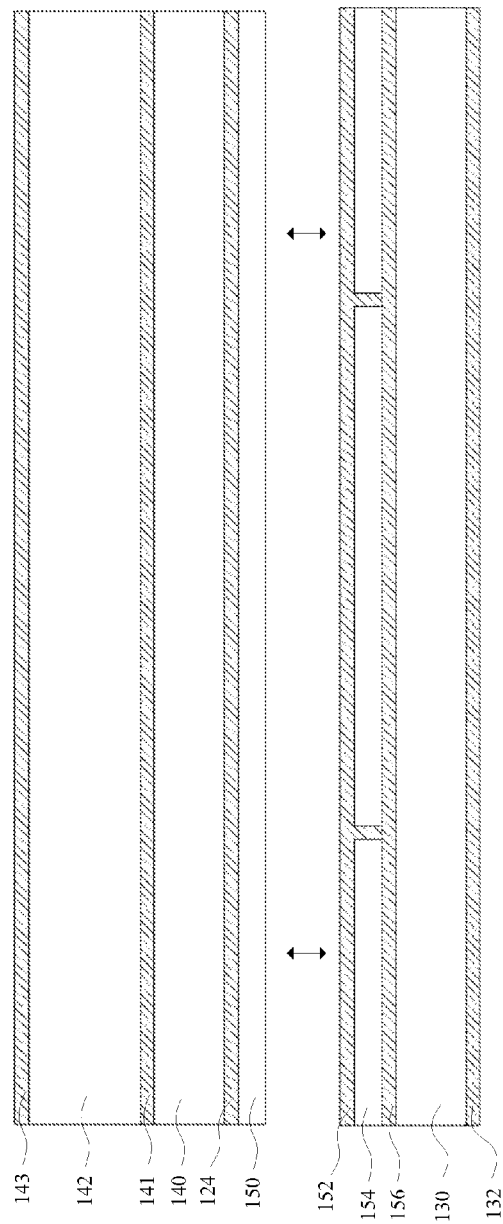
FIGS. 13-14 are cross-sectional side view illustrations of a method of bonding a double SOI stacked wafer to a base substrate with defined cavities in accordance with an embodiment.

Referring to FIG. 13, in an embodiment, a double SOI wafer configuration is prepared for bonding to the patterned cavity template layer 154. The double SOI wafer configuration may include spring support layer 150 and device layer 140 grown on a handle substrate 142 to specified thicknesses for achieving specific spring characteristics and electrode configurations. In an exemplary embodiment, the double SOI wafer stack includes a 2 μm backside oxide ($SiO_2$) layer 143, a 500 μm silicon handle substrate 142, a 1 μm thick etch stop layer 141 (buried oxide, $SiO_2$), a 15 μm thick device layer 140 (silicon), a 1 μm thick insulating layer 124 (buried oxide, $SiO_2$), and a 3 μm thick spring support layer 150 (silicon).

Figure 14:
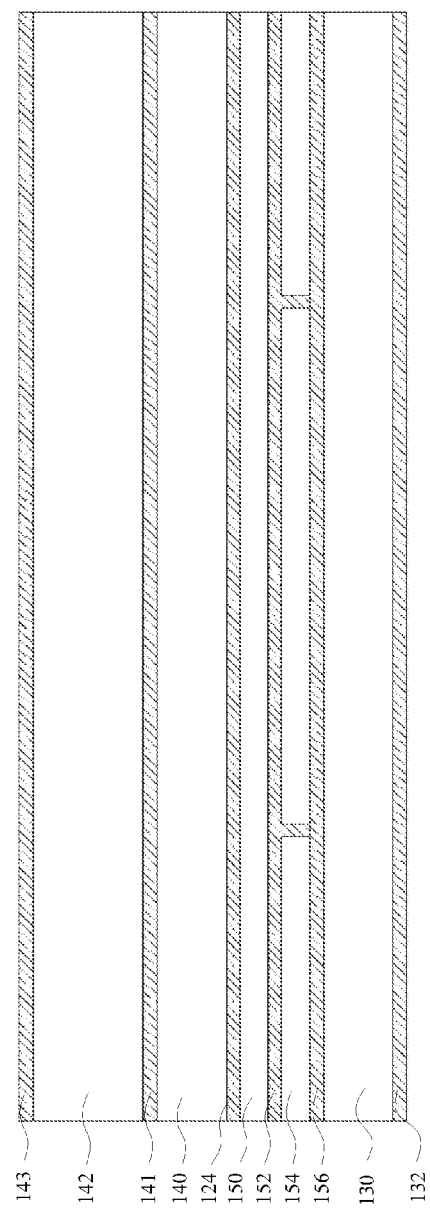
Figure 15:
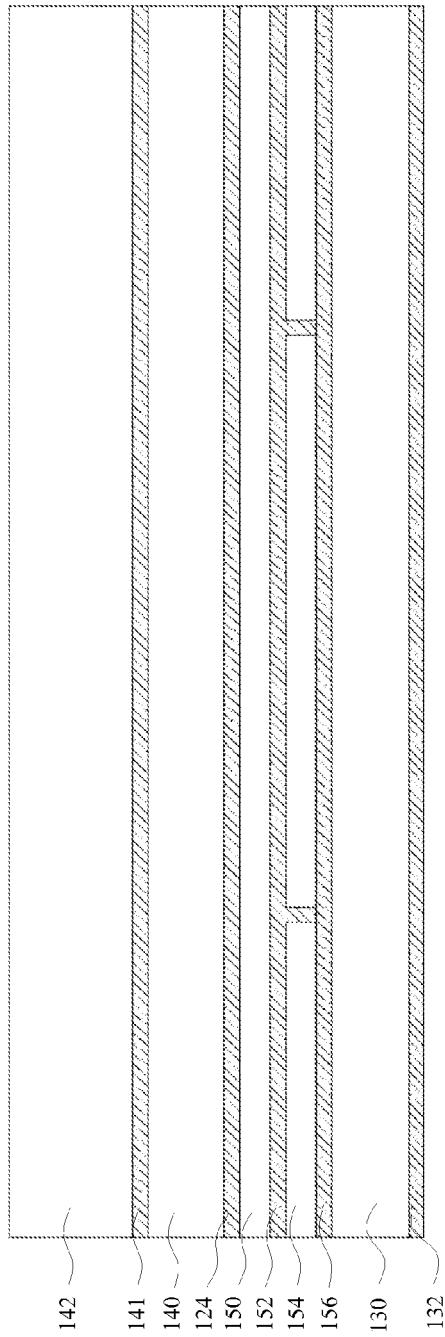
Figure 16:
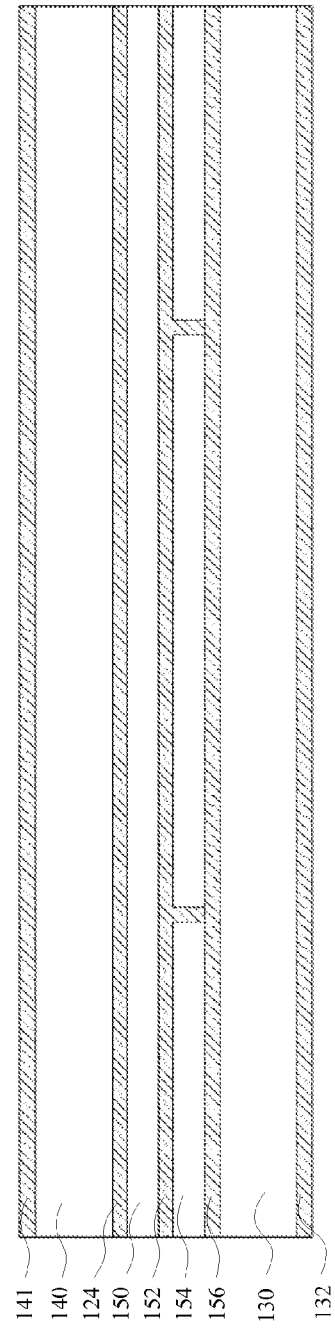

In an embodiment the double SOI wafer configuration of FIG. 13 is then bonded to the patterned cavity template layer as illustrated in FIG. 14. In this manner, the sacrificial portions 154B corresponding to cavities 136 can be pre-patterned prior to patterning the spring support layer 150 and device layer 140, while still providing structural support. This may protect the integrity of the final spring support layer 150 and final device layer 140 by allowing the spring release etch operation and removal of sacrificial portions 154B at a terminal processing operation. As illustrated in FIGS. 13-14, the spring support layer 150 may be fusion bonded to the second confinement layer 152 to form a Si—$SiO_2$ fusion bond. Following wafer bonding, the oxide layer 143 is removed as illustrated in FIG. 15, for example using reactive ion etching (RIE) or grinding, followed by thinning of the handle substrate 142 using an etching or grinding technique. The final portion of the thinned handle substrate 142 may then be removed, using DRIE etching, for example, stopping on the etch stop layer 141 as illustrated in FIG. 16.

Figure 17:
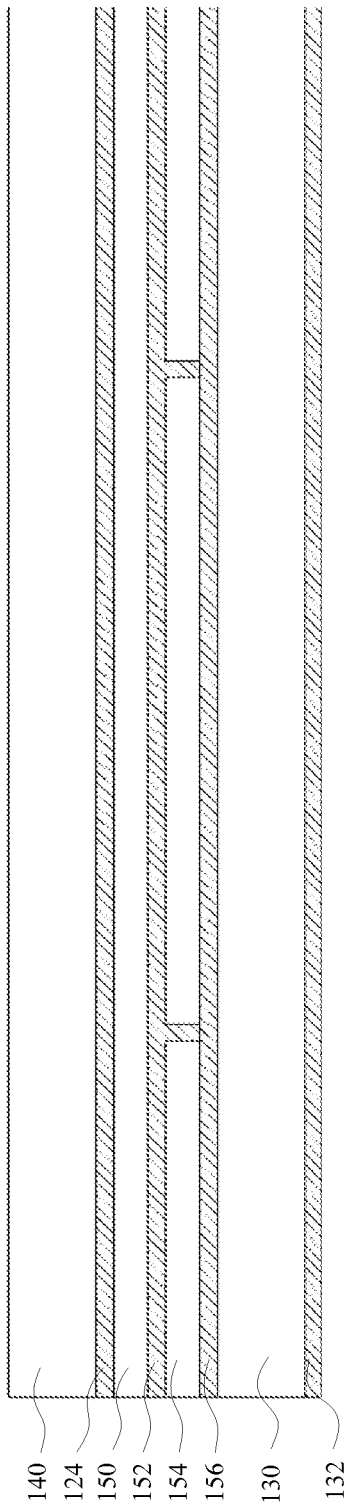

Following removal of the thinned handle substrate 142, the etch stop layer 141 is removed as illustrated in FIG. 17, exposing device layer 140. In one embodiment, the etch stop layer 141 is removed using a wet etching technique, such as a buffer oxide etch (BOE) chemistry. A BOE chemistry may be more selective than a DRIE technique, for example, allowing for a resultant uniform thickness of the device layer 140, from which the mesa structures 112 will be formed. In this manner, a controlled and uniform height of the compliant electrostatic transfer heads is achieved.

Figure 18:
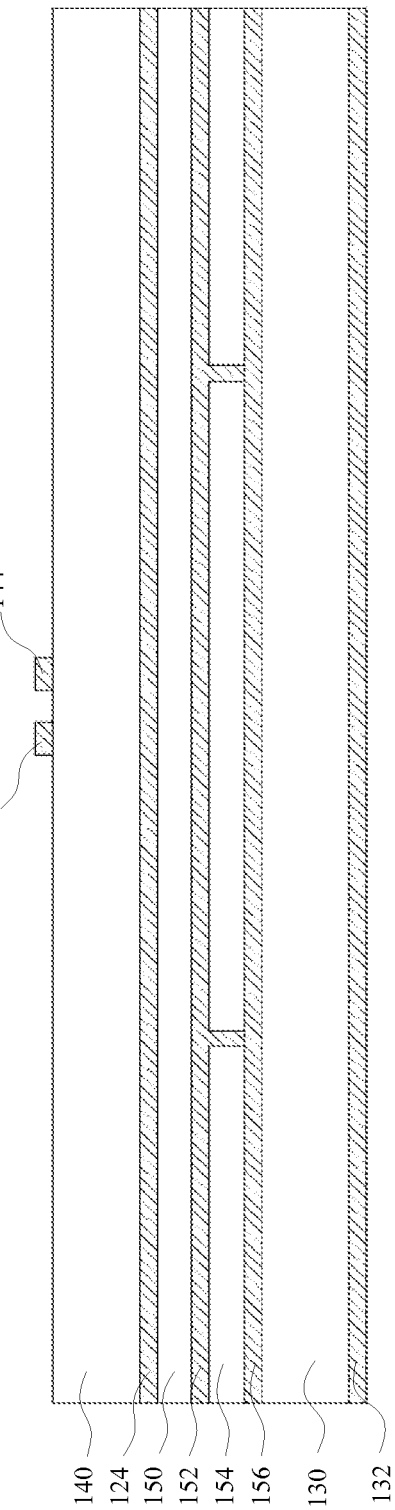
Figure 19:
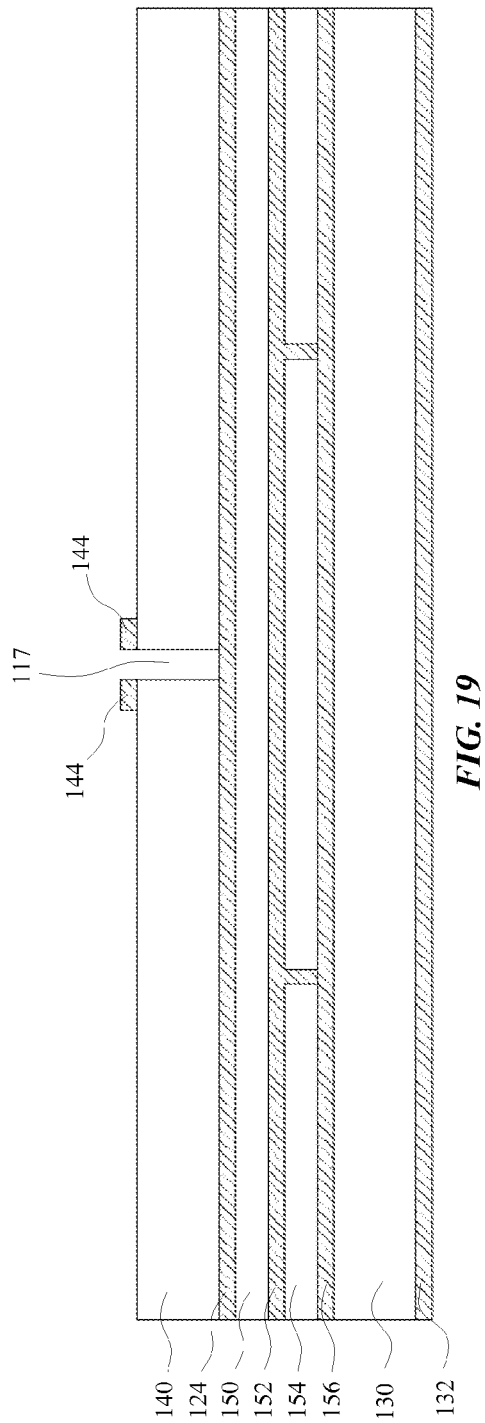

Referring to FIG. 18, a mesa etch mask 144 is formed on the device layer 140. In an embodiment, mesa etch mask 144 is formed by thermal oxidation ($SiO_2$) of the device layer 140, followed by reactive ion etching (RIE) stopping on the underlying device layer 140. In an embodiment, the mesa etch mask 144 is approximately 0.3 μm thick. Exemplary RIE etching chemistries may include fluorinated chemistries such as $CHF_3$, $CF_4$. Other suitable etching techniques of the thermal oxide include ion milling, plasma etching, reactive ion beam etching (RIBE), electron cyclotron resonance (ECR), or inductively coupled plasma (ICP). Following the formation of the mesa etch mask 144, any remaining patterned positive photoresist used may be removed using $O_2$ ashing flowing by piranha etch. An additional patterned positive photoresist may then be formed, with openings between the mesa etch mask 144 pairs, followed by DRIE etching of the device layer 140 to form trenches 117 between the mesa structures 112 of the silicon electrodes to be formed, stopping on insulting layer 124. In an embodiment, DRIE etching is performed using a fluorine based chemistry such as $SF_6$ or $C_4F_8$. Following the formation of trenches 117, any remaining patterned positive photoresist used may be removed using $O_2$ ashing flowing by piranha etch resulting in the structure illustrated in FIG. 19.

Figure 20:
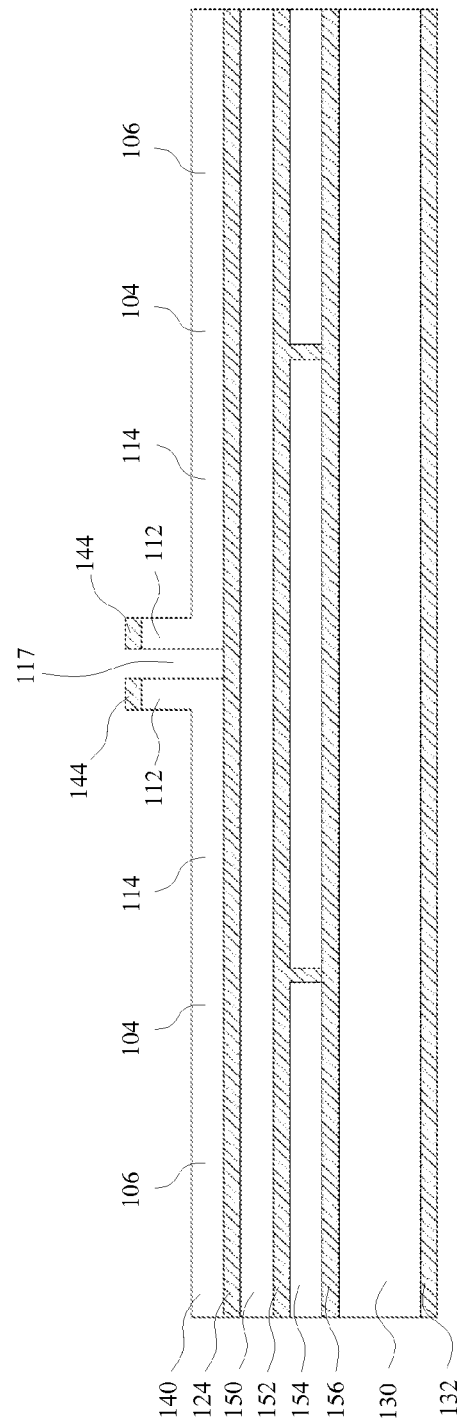

Referring to FIG. 20, the mesa etch masks 144 may remain, while the remainder of the device layer 140 is thinned down using a timed etch to achieve a resultant thickness of device layer 140 that will correspond to a thickness of the electrode leads 114 and interconnects 104, 106. $O_2$ plasma etching may then be performed to remove DRIE residue followed by a BOE etch for removal of the mesa etch masks 144, resulting in the structure illustrated in FIG. 21A. In an embodiment, a thickness or height ($EL_H$) of the thinned device layer 140 corresponding to the electrode leads 114 and interconnects 104, 106 is approximately 5 μm. In an embodiment, a height of the mesa structures 112 ($M_H$) is approximately 15 μm. In an embodiment, the total silicon thickness above sacrificial portions 154B at locations other than where the mesa structures 112 or trenches 117 are formed is approximately 8 μm (3 μm spring support layer 150, 5 μm patterned device layer 140).

Figure 21A:
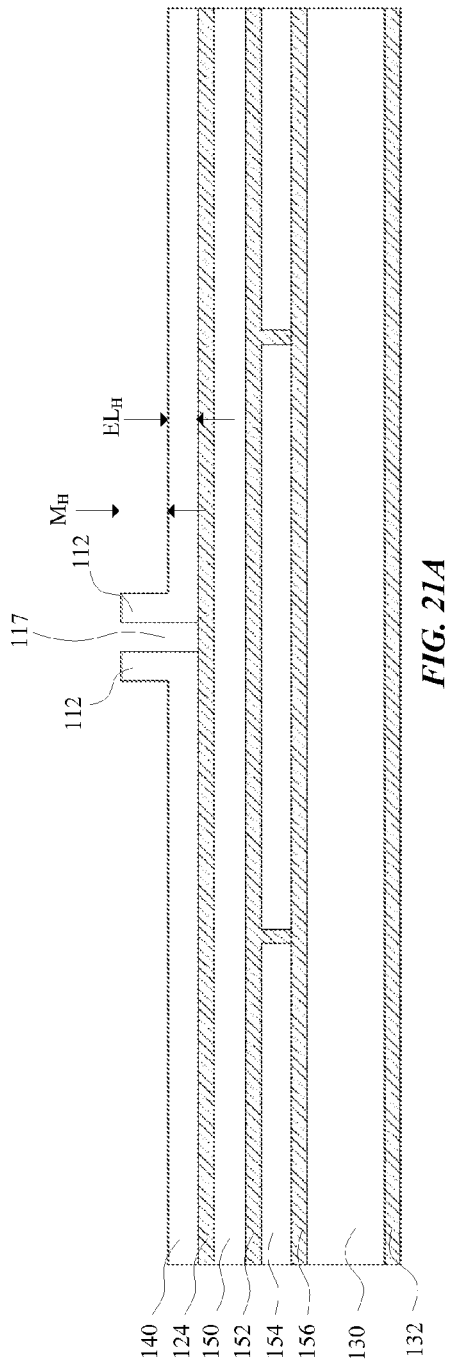
Figure 21B:
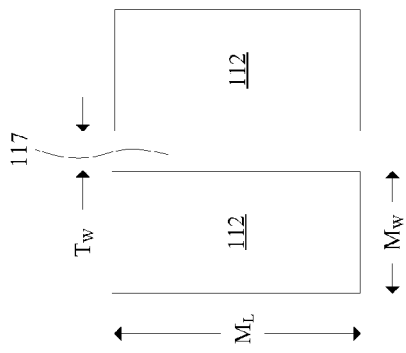

FIG. 21B is a schematic top view illustration of an exemplary mesa structure configuration in a bipolar compliant electrostatic transfer head in accordance with an embodiment. In the particular configuration illustrated, each bipolar compliant electrostatic transfer head has an approximate square contact surface. As such a mesa length ($M_L$) is approximately equal to the sum of two mesa widths ($M_W$) and a trench 117 width ($T_W$). The dimensions of the mesa structures 112 illustrated in FIG. 21B are approximately the same as the mesa etch masks 144 used to form the mesa structures 112. By way of example, for an exemplary 10 μm×10 μm electrostatic transfer head, each mesa structure 112 includes $M_W \times M_L$ dimensions of approximately 4.5 μm×10 μm, and a $T_W$ of approximately 1 μm. By way of example, for an exemplary 5 μm×5 μm electrostatic transfer head, each mesa structure 112 includes $M_W \times M_L$ dimensions of approximately 2.25 μm×5 μm, and a $T_W$ of approximately 0.5 μm. It is to be appreciated that these dimensions are exemplary, and that both larger and smaller dimensions are contemplated in accordance with embodiments.

Referring now to FIG. 22 the device layer 140 is patterned. Specifically, the device layer is etched to form silicon interconnect 104, 106 and silicon electrode lead 114 profiles. As illustrated, beam profile openings 145 correspond to the electrode lead 114 patterns, and particularly the electrode beam profiles illustrated in FIG. 1A. Trenches 116 correspond to trenches 116 that partially define the silicon electrodes 110 and silicon interconnects 104, 106. Via openings 120B correspond to openings in the device layer 140 for providing an electrical connection to plug 135, yet to be formed. Via opening 120B is a portion of a collection of features referred to herein collective as via 120.

Following the patterning of trenches 116, via openings 120B, and beam profile opening 145 in the device layer 140, the trenches 116, via openings 120B, and beam profile opening 145 are etched though the insulating layer 124 using a suitable technique, such as RIE using a fluorine based chemistry such as $CF_4$ or $CHF_3$. As illustrated in FIG. 23, the insulating layer 124 is not etched underneath trenches 117.

Referring now to FIGS. 24-25, following etching of the insulating layer 124, openings 120B are etched through the spring support layer 150 using a suitable etching technique such as DRIE (e.g. $SF_6$ chemistry) followed by etching through the second confinement layer 152 using a suitable etching technique such as RIE (e.g. $CF_4$ or $CHF_3$ chemistry), stopping on the cavity template layer 154. In an embodiment, the same etching mask is used for etching through both the spring support layer 150 and the second confinement layer 152. In the particular embodiment illustrated, openings 120B, 145 through the device layer 140 are wider than the openings 120B, 145 through the spring support layer 150.

Figure 26:
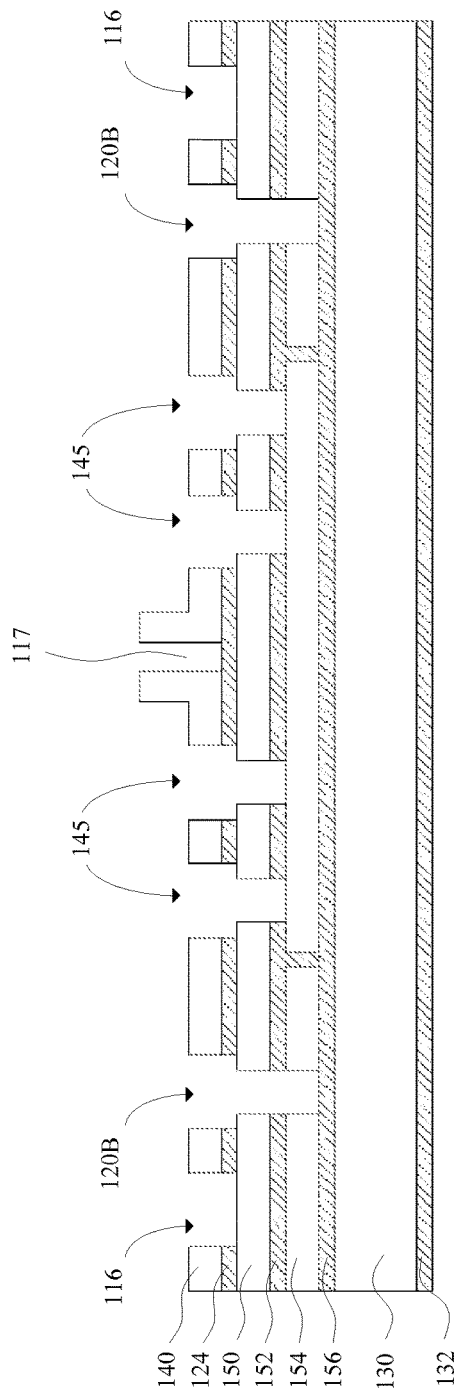
Figure 27:
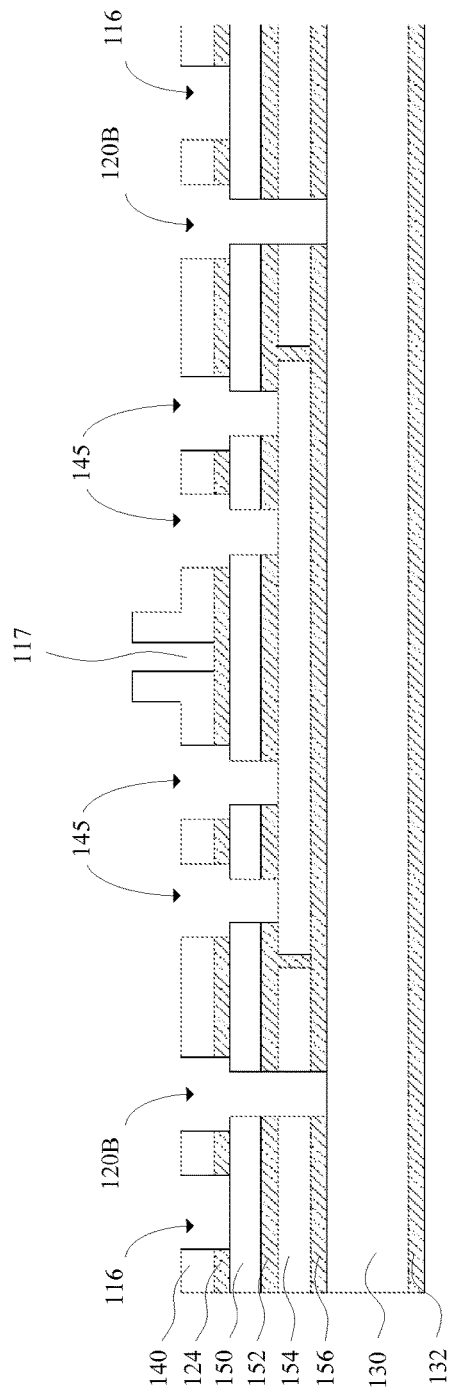

Openings 120B corresponding to contact holes are then etched through the cavity template layer 154 and first confinement layer 156 stopping on the base substrate 130, as illustrated in FIGS. 26-27, using a suitable etching technique such as DRIE (e.g. $SF_6$ chemistry) for etching through cavity template layer 154 and RIE (e.g. $CF_4$ or $CHF_3$ chemistry) for etching through the first confinement layer 156.

Figure 28:
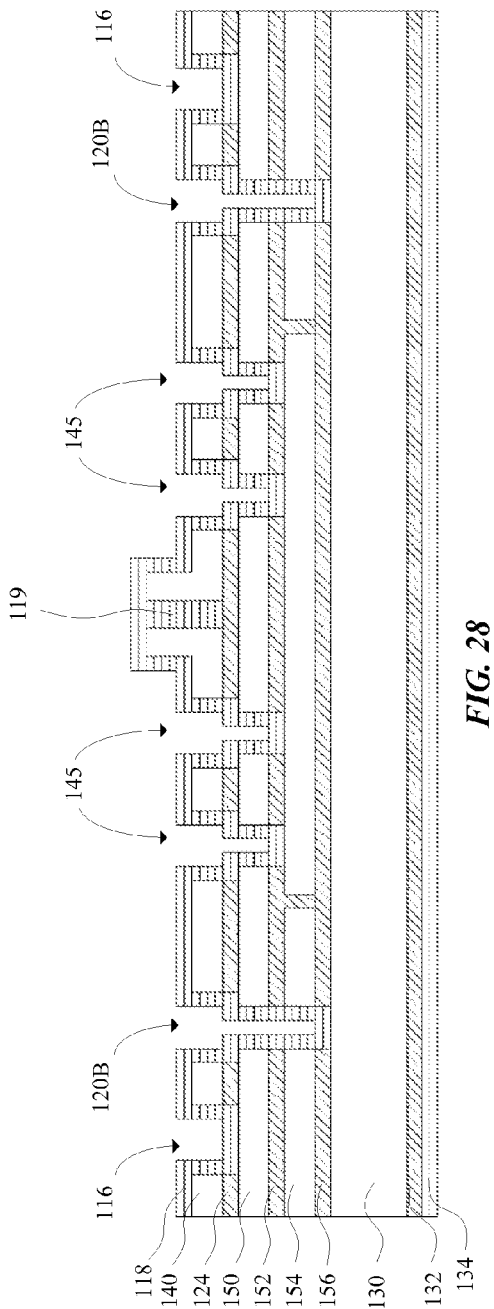

Referring now to FIG. 28 a dielectric layer 118 and optionally a second dielectric layer are formed over the patterned device layer 140. Formation of dielectric layer 118 may also simultaneously form backside passivation layer 134. Dielectric layer 118 can be used to provide the desired dielectric constant and/or dielectric breakdown strength, and resultant pick-up pressure of the electrostatic transfer head. In an embodiment, dielectric layer 118 is atomic layer deposition (ALD) $SiO_2$, $Al_2O_3$, $Ta_2O_5$, $HfO_2$, $Si_3N_4$, or $RuO_2$. In an embodiment, dielectric layer 118 is an approximately 5,000 angstrom thick ALD $Al_2O_3$ layer. In an embodiment, dielectric layer 118 fills trench 117 between mesa structures 112 and provides a dielectric joint 119 between and connecting the pair of silicon electrodes 110. Such a dielectric joint 119 may provide additional mechanical stability to the electrode design.

Figure 29:
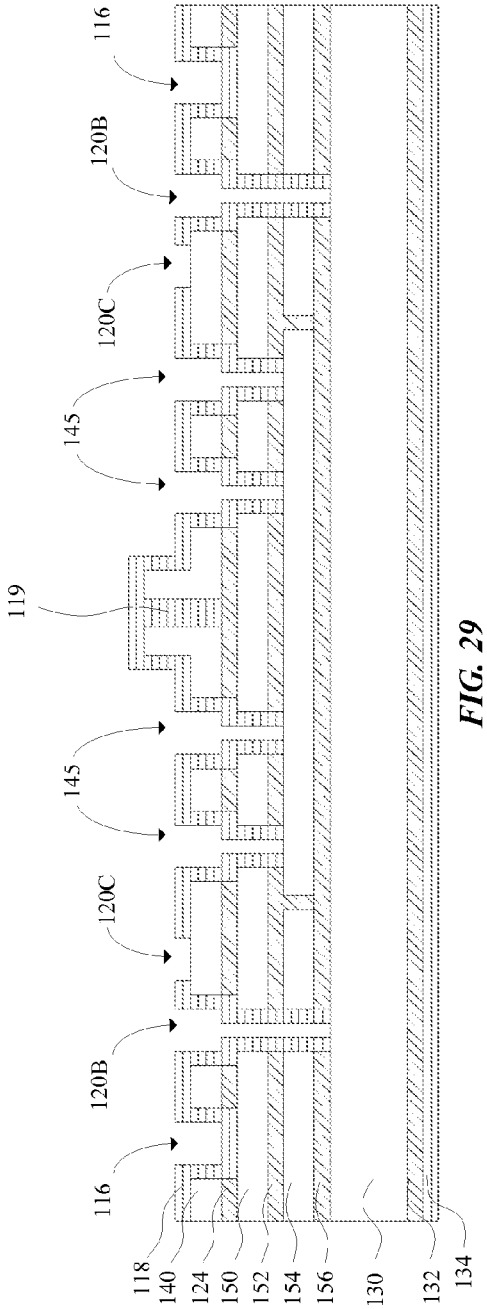

As illustrated, dielectric layer 118 may be formed over the patterned device layer 140, and within the trenches 116, 117, via openings 120B, and beam profile opening 145. In this manner, the dielectric layer provides electrical insulation. For example, the dielectric layer 118 may provide electrical insulation within the via opening 120B. Referring now to FIG. 29, via openings 120B, contact openings 120C, and beam profile opening 145 are formed through the dielectric layer 118 stopping on the base substrate 130 (for via opening 120B), patterned device layer 140 (for via opening 120C), and sacrificial portion 154B of cavity template layer 154 (for beam profile opening 145). Referring briefly back to FIG. 1A, in an embodiment, contact openings 120C are located above bus interconnects 106.

In an embodiment, via openings 120B, contact openings 120C, and beam profile openings 145 are etched in the dielectric layer 118 using a suitable etching chemistry such as a fluorine based RIE (e.g. $CHF_3$, $CF_4$), stopping on the underlying silicon layers 130, 140, 154. Following etching of the dielectric layer 118 an $O_2$ plasma and solvent wet clean may be performed to remove any residues and photoresist used for patterning.

Referring now to FIG. 30, a top conductive contact 123 is formed within each via opening 120B to make electrical contact with the base substrate 130. In the particular embodiment illustrated, top conductive contact 123 also spans along a top surface of the dielectric layer 118 and is formed within contact opening 120C and on bus electrode 106. In this manner, each top conductive contact 123 provides an electric path from a bus electrode 106 to the base substrate 130. In an embodiment, top conductive contacts 123 include a TiW and Au stack. In an embodiment, top conductive contacts 123 are formed of about 500 to 1,000 angstroms TiW followed by 1,000 to 5,000 angstroms Au. Top conductive contacts may be formed by any suitable method such as sputtering.

Figure 32:
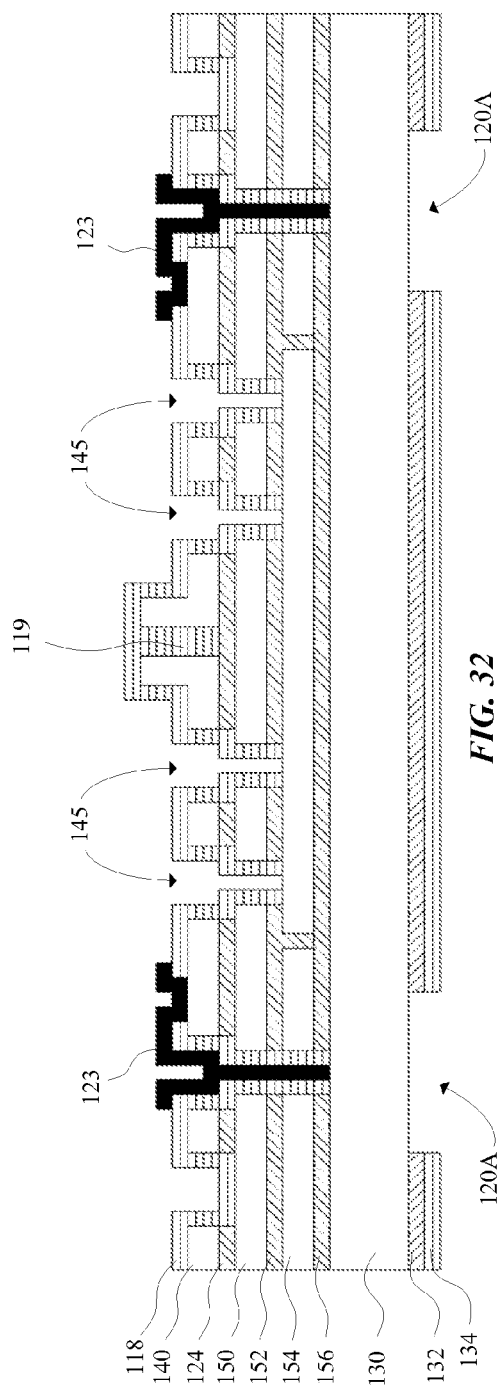
Figure 33:
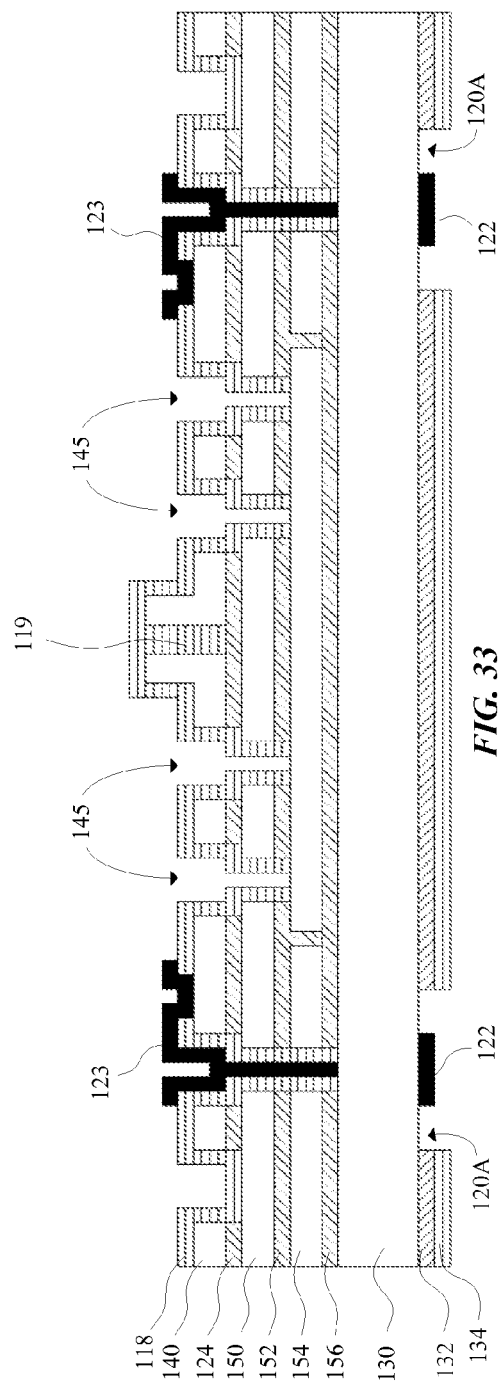
Figure 34:
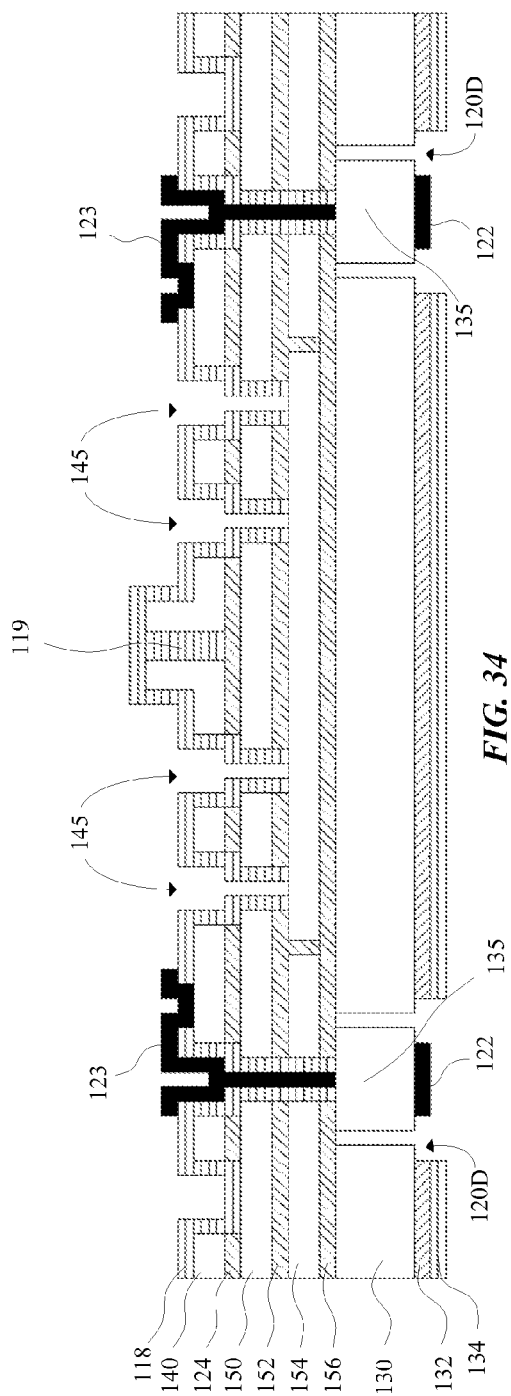

FIGS. 31-34 illustrate a manner of forming via plugs in the base substrate 130, in accordance with an embodiment. As illustrated in FIG. 31, via openings 120A are formed through the back side passivation layer 134 using a suitable technique such as ion milling or RIE, stopping on the back side passivation layer 132. As illustrated in FIG. 32, via opening 120A is etched through back side passivation layer 132 using a suitable technique such as a BOE or RIE to contact the base substrate 130. Following etching through the passivation layers to contact the base substrate 130, the back side of the SOI stack is $O_2$ plasma and solvent cleaned to remove any photoresist, and the base substrate 130 may be pre-cleaned with an Ar plasma clean. Referring now to FIG. 33 back side conductive contacts 122 are formed on the exposed base substrate 130 within via openings 120A. In an embodiment, back side conductive contacts 122 include a TiW and Au stack. In an embodiment, back side conductive contacts 122 are formed of about 500 to 1,000 angstroms TiW followed by 1,000 to 5,000 angstroms Au. Back side conductive contacts may be formed by any suitable method such as sputtering.

Following the formation of back side conductive contacts 122, the back side of the SOI stack is $O_2$ plasma and solvent cleaned to remove any photoresist, and the base substrate 130 is etched to form via openings 120D through the base substrate 130. In the particular embodiment illustrated in FIG. 34, via openings 120D terminate at a bottom surface of first confinement layer 156, and beneath where bus interconnect 106 is located. As a result a via plug 135 is formed within the via opening 120D. With such a configuration, via plug 135 is electrically isolated from the base substrate 130. In an embodiment, via openings 120D are etched using a suitable etching technique such as DRIE with a fluorine based chemistry such as $SF_6$. Following the formation of via plugs 135, the back side of the SOI stack is $O_2$ plasma and solvent cleaned to remove any photoresist.

Figure 35:
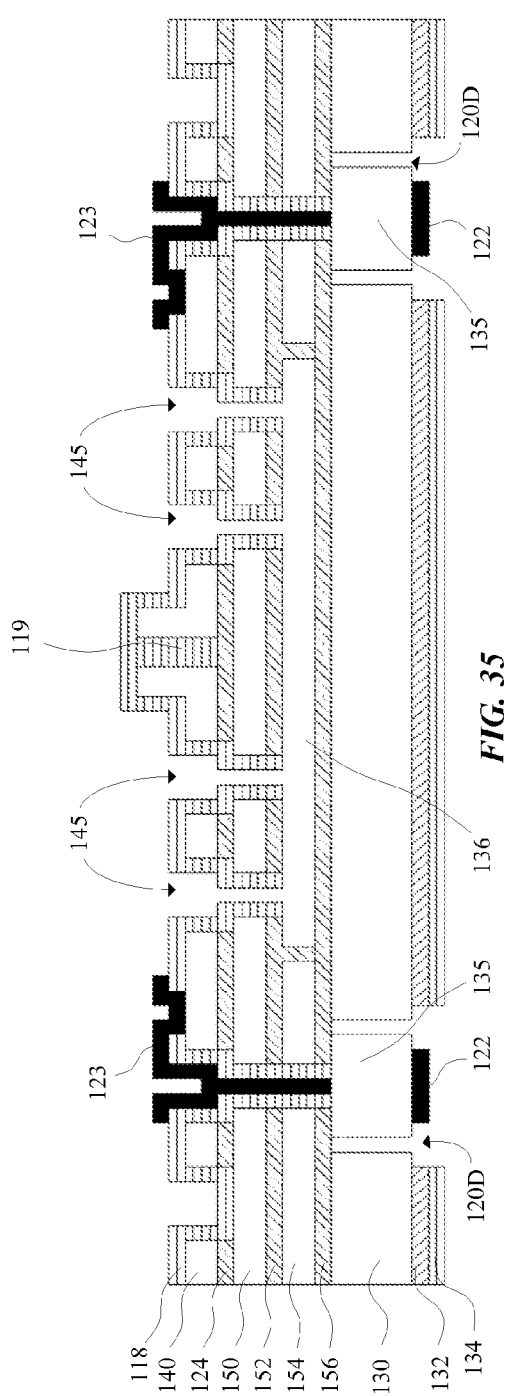

Referring now to FIG. 35, a spring release etch operation is performed in accordance with embodiments. Up until this point the electrode beam profiles of the silicon electrodes and the spring support layer beam profiles of the spring support layer 150 have been supported by the patterned cavity template layer 154. Referring to FIG. 35, the sacrificial portions 154B of the patterned cavity template layer 154 are selectively etched through the beam profile openings 145 to form cavities 136. This releases the electrode beam profiles of the silicon electrodes and the spring support layer beam profiles over the cavities. In an embodiment, the spring release etch operation is performed using a gas phase $XeF_2$ etch using the confinement layers 156, 152 as etch stop layers to define cavities 136. Following the spring release etch operation the SOI stack is $O_2$ plasma and solvent cleaned to remove any photoresist. The SOI stack may then be diced if multiple micro pick up arrays are to be singulated from the same SOI stack.

Figure 36:
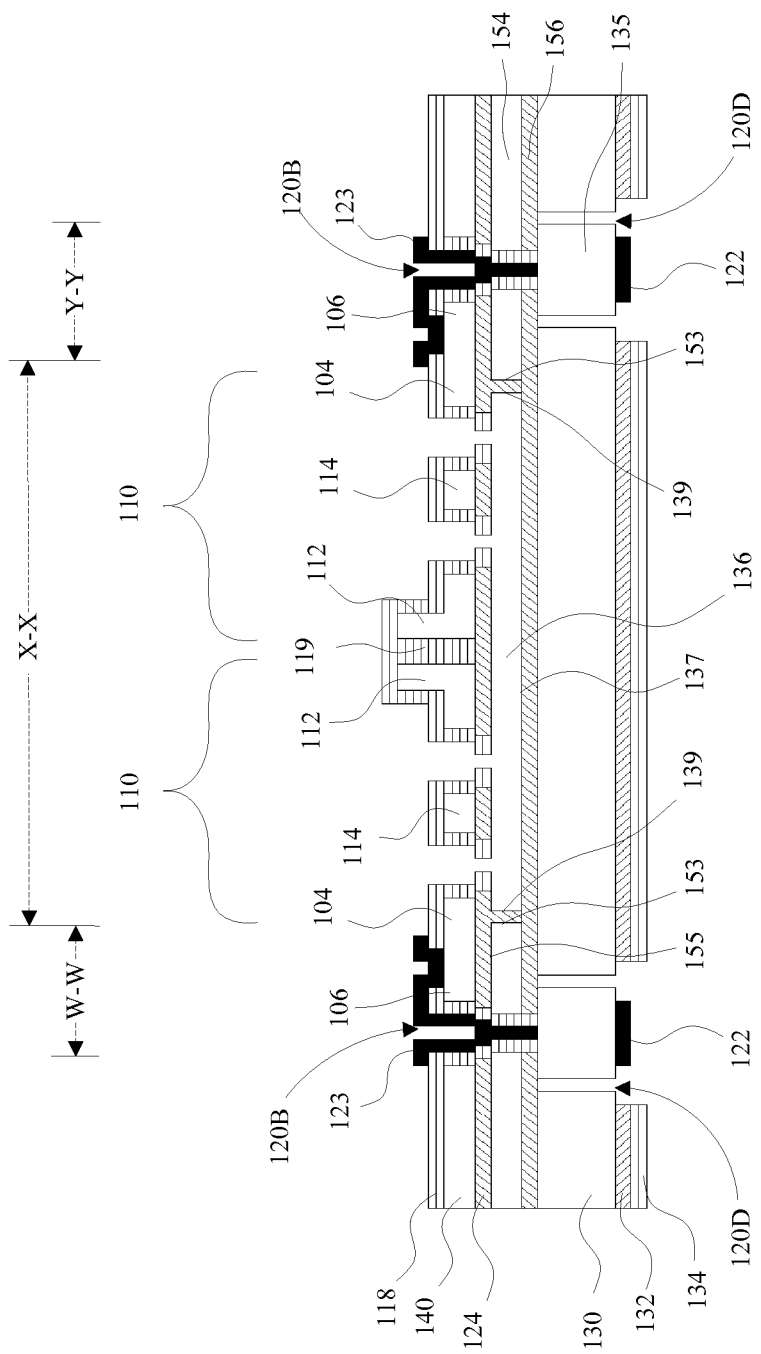
FIG. 36 is a combination cross-sectional side view illustration taken along lines W-W, X-X, and Y-Y from FIG. 1A in accordance with an embodiment.
Figure 37:
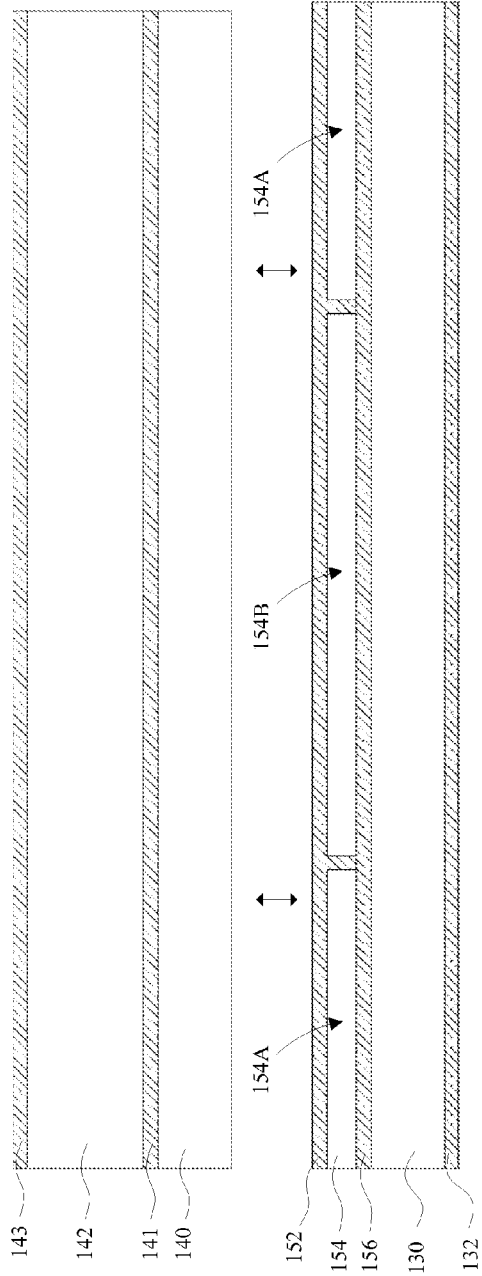
FIGS. 37-38 are cross-sectional side view illustrations of a method of bonding an SOI wafer to a base substrate with defined cavities in accordance with an embodiment.
Figure 38:
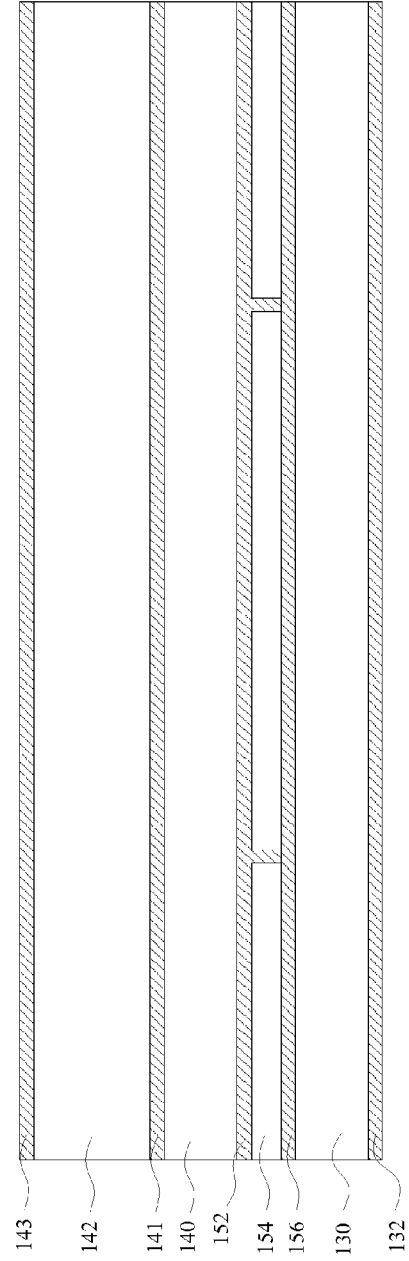
Figure 39:
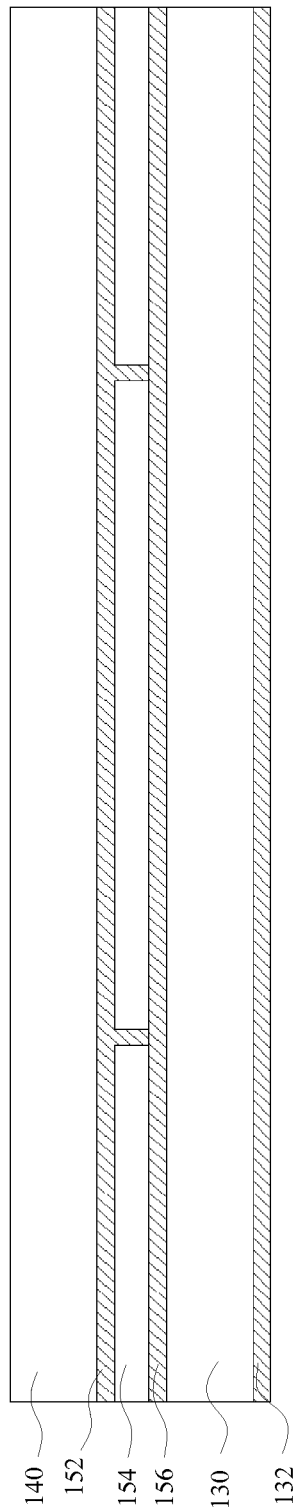
Figure 40:
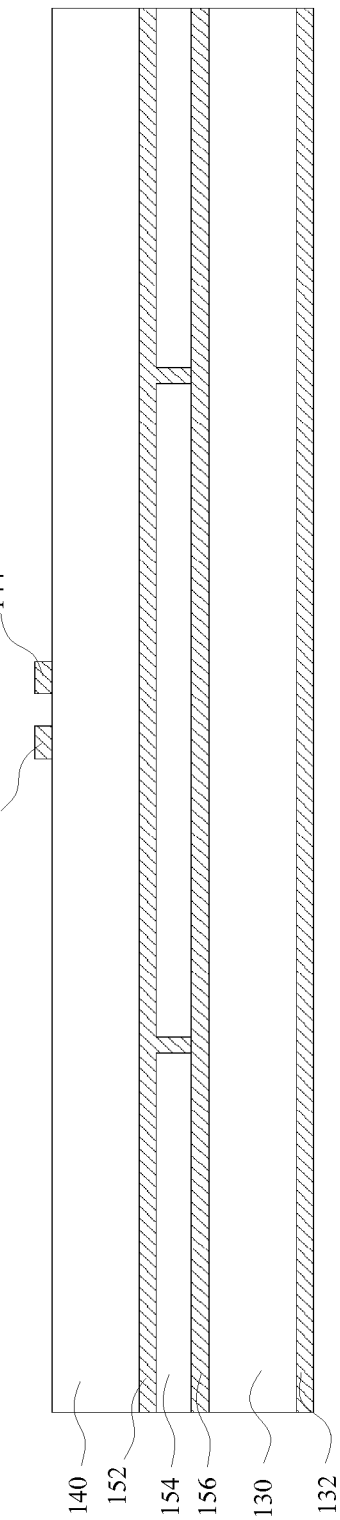
Figure 43:
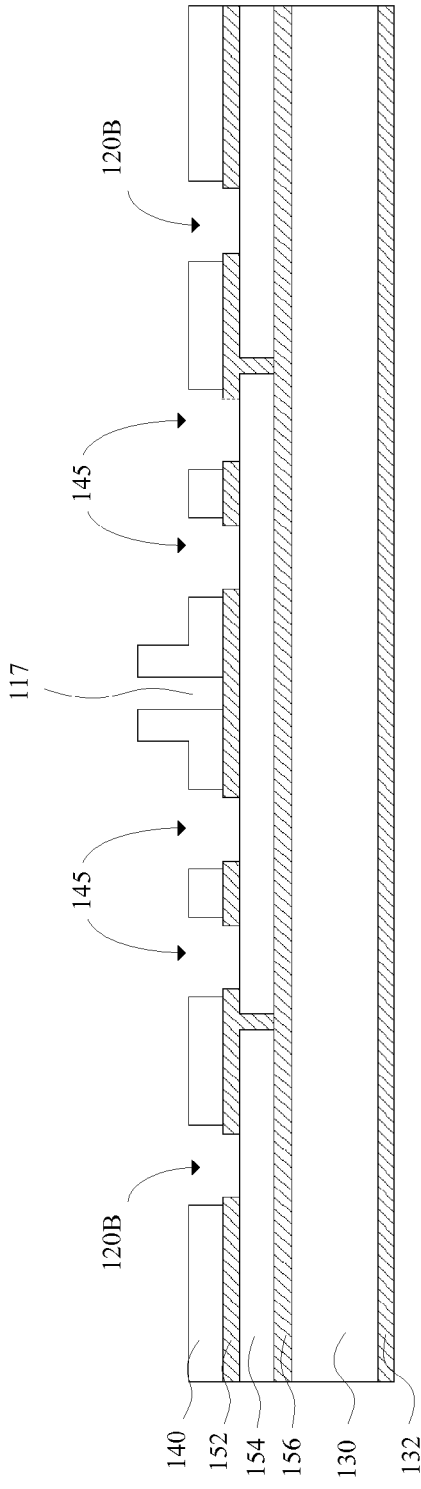
Figure 44:
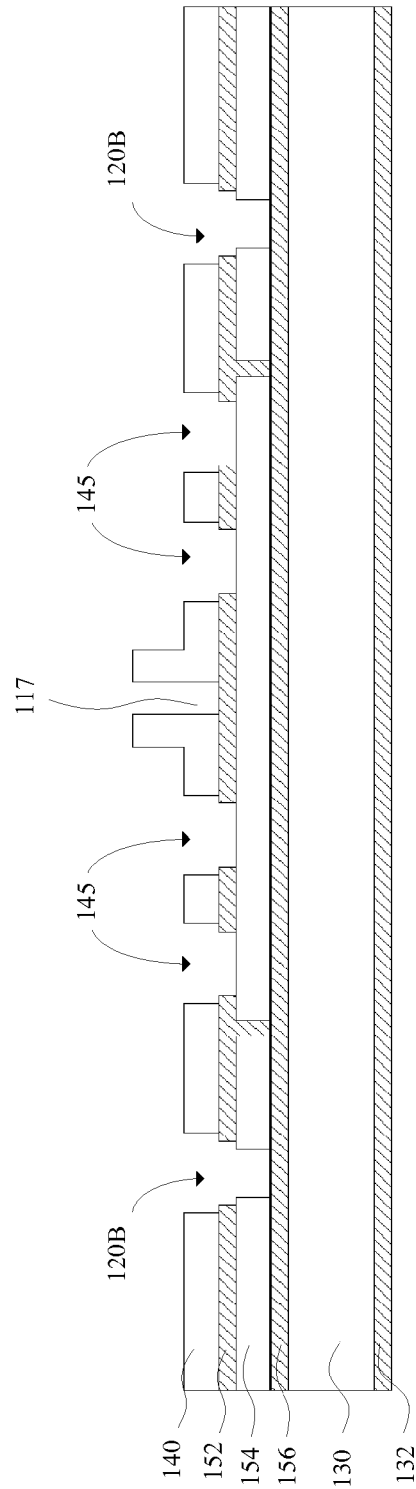
Figure 45:
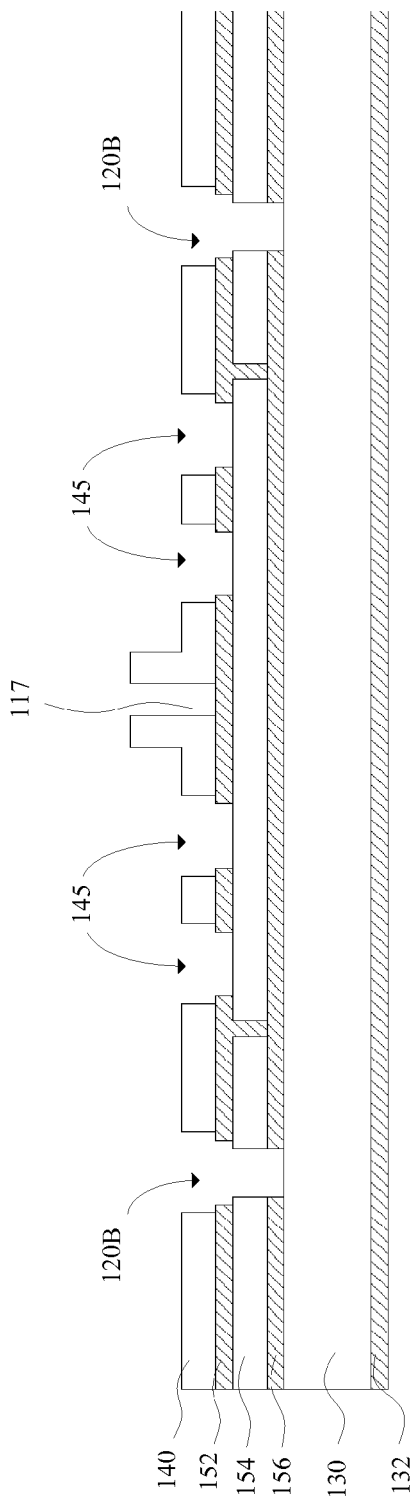
Figure 46:
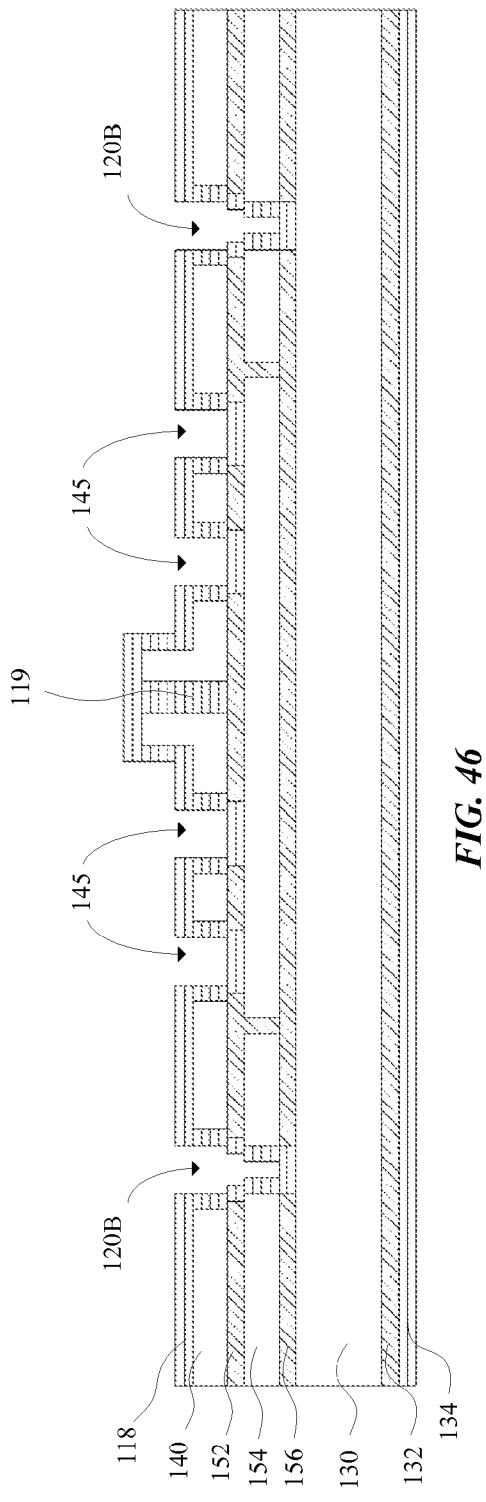
Figure 47:
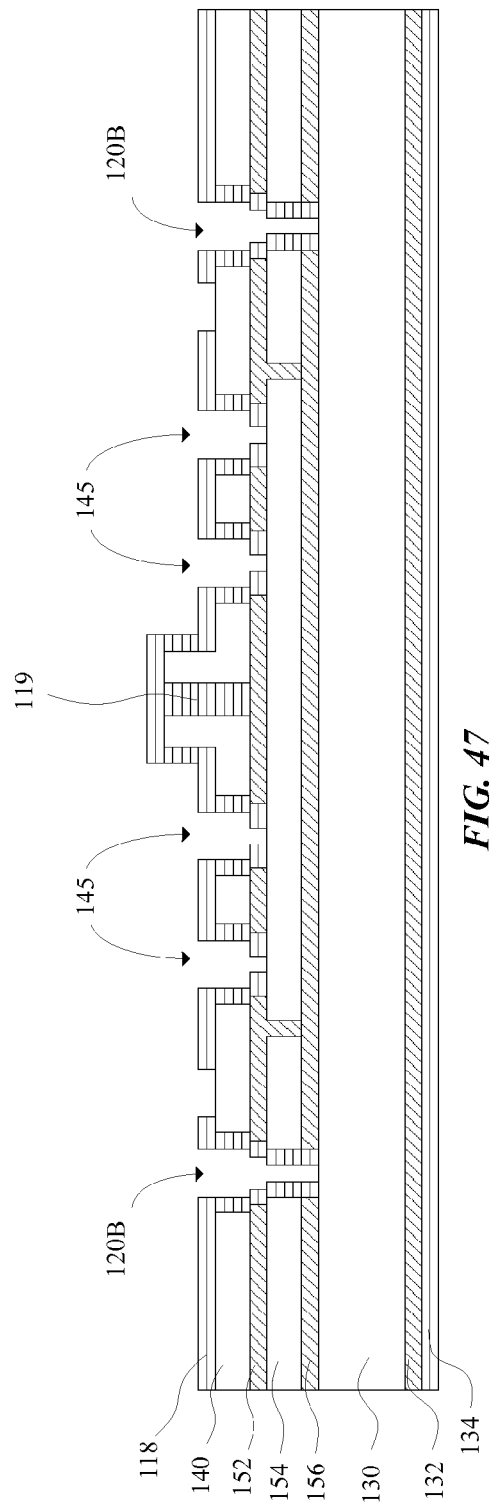
Figure 48:
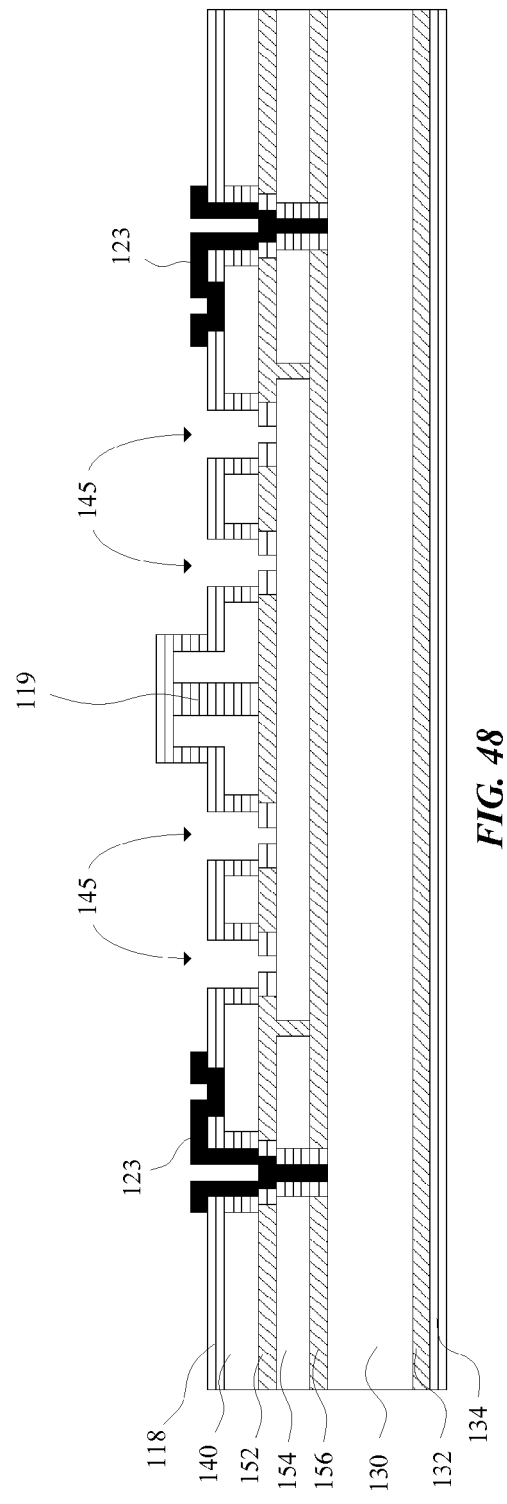
Figure 49:
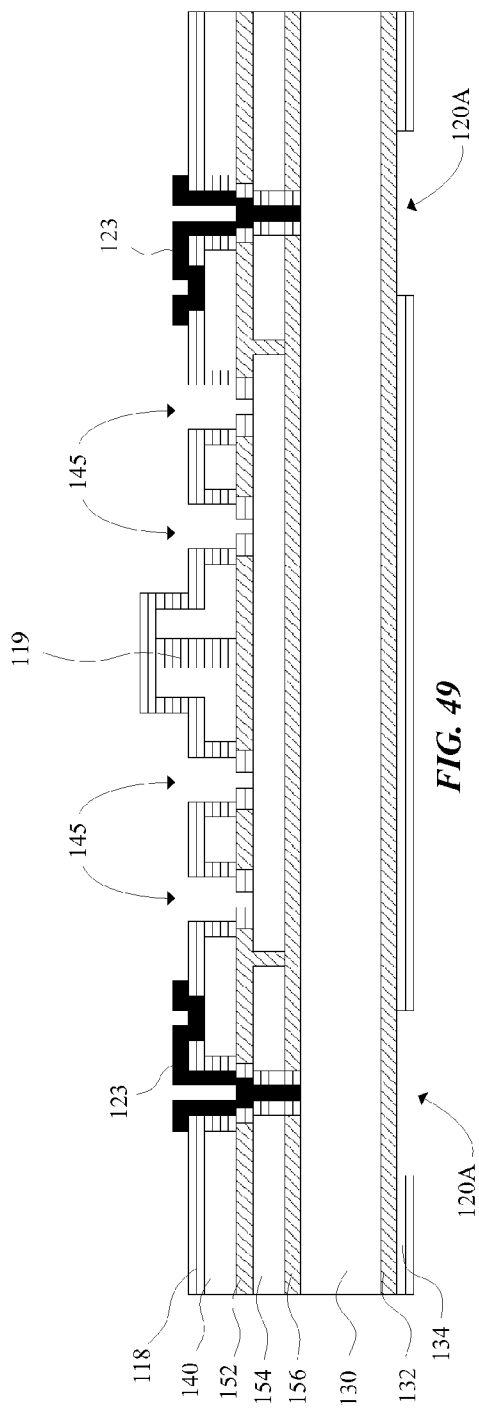
Figure 50:
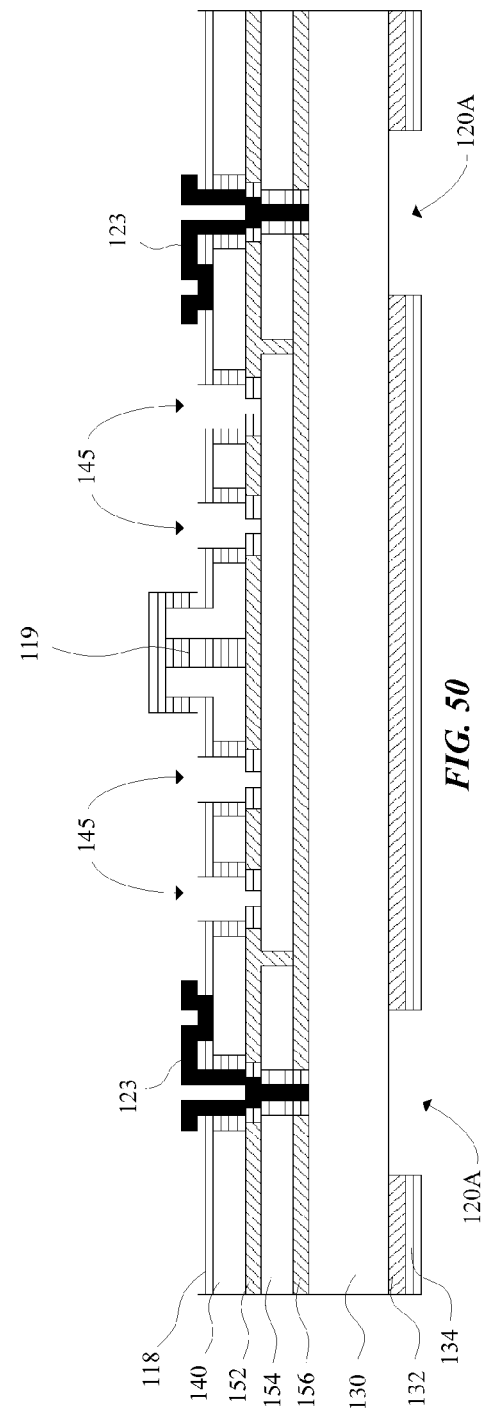
Figure 51:
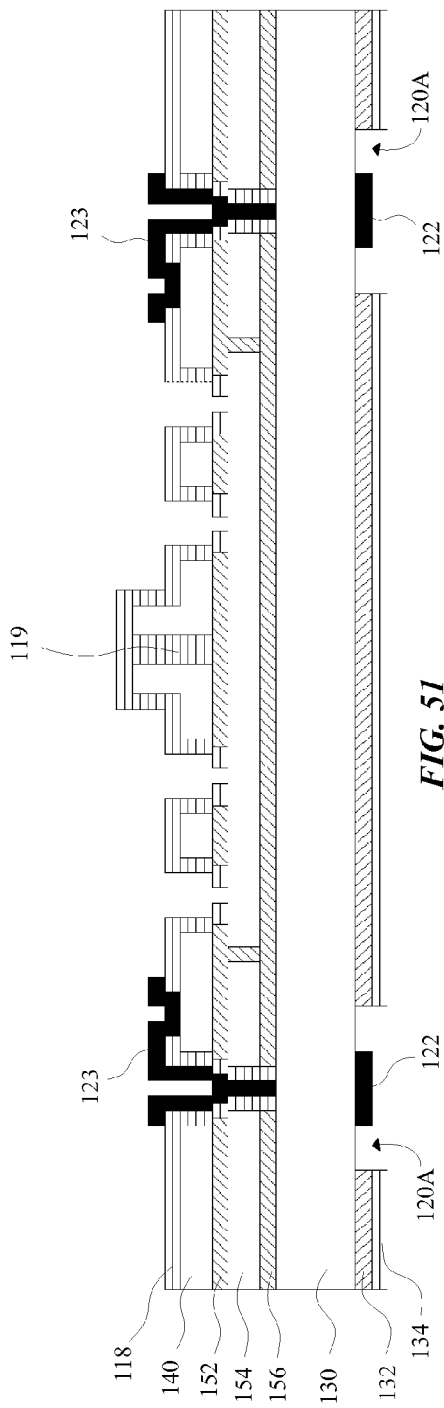
Figure 52:
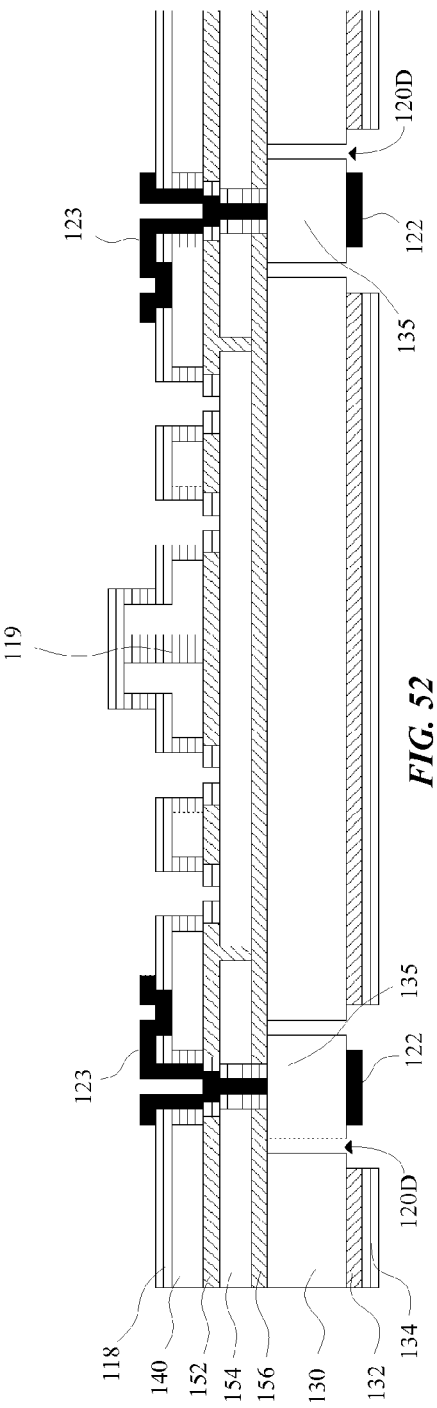
Figure 53:
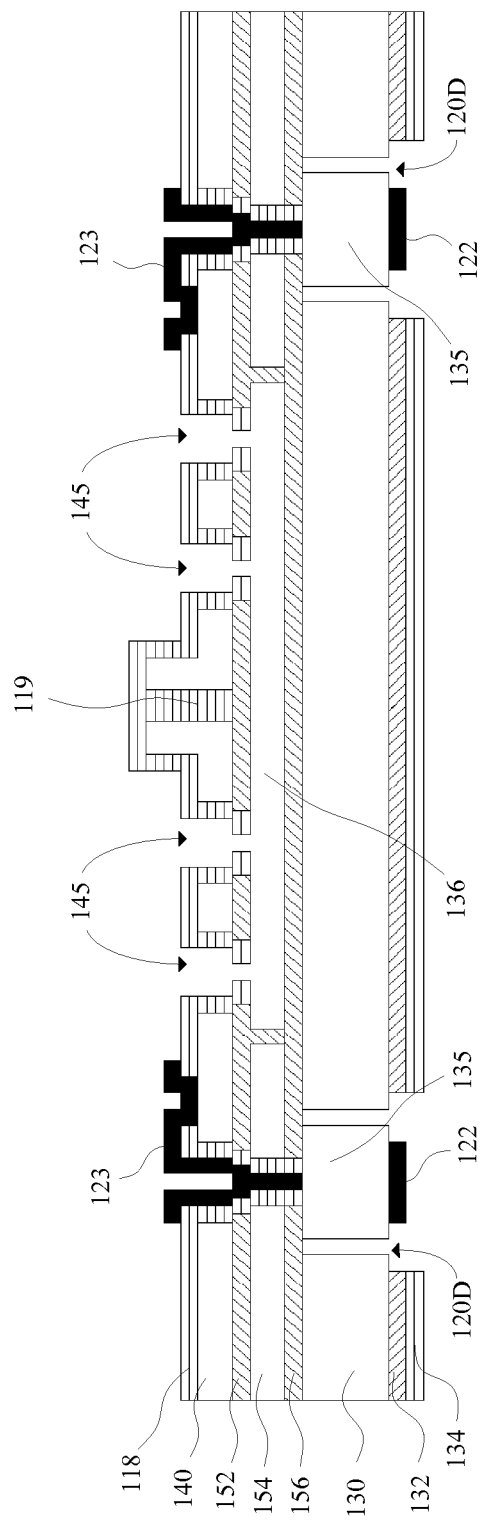

FIG. 36 is a combination cross-sectional side view illustration of an electrostatic transfer head configuration with defined cavity similar to FIG. 9 taken along lines W-W, X-X, and Y-Y from FIG. 1A in accordance with an embodiment. FIG. 36 is substantially similar to FIG. 9, with one difference being the exclusion of spring layer 150 and insulating layer 124. Additionally, illustration of trenches 116 is not illustrated, though trenches 116 may likewise be formed. FIGS. 37-53 illustrate a manner of fabricating the electrostatic transfer head configuration of FIG. 36 in accordance with embodiments. In order to not overly obscure embodiments, a description of repetitive process characteristics and operations are not repeated. Referring briefly to FIGS. 37-38 an SOI wafer is bonded to a patterned cavity template layer similarly as described with regard to FIGS. 12-14. One difference being, is that the SOI wafer in FIG. 37 is does not include a spring layer 150 or insulating layer 124. Similarly, the features and processing operations related to the FIGS. 39-53 is similar to that described above with regard to FIGS. 15-35, with the omission of spring layer 150 and insulating layer 124.

Figure 54:
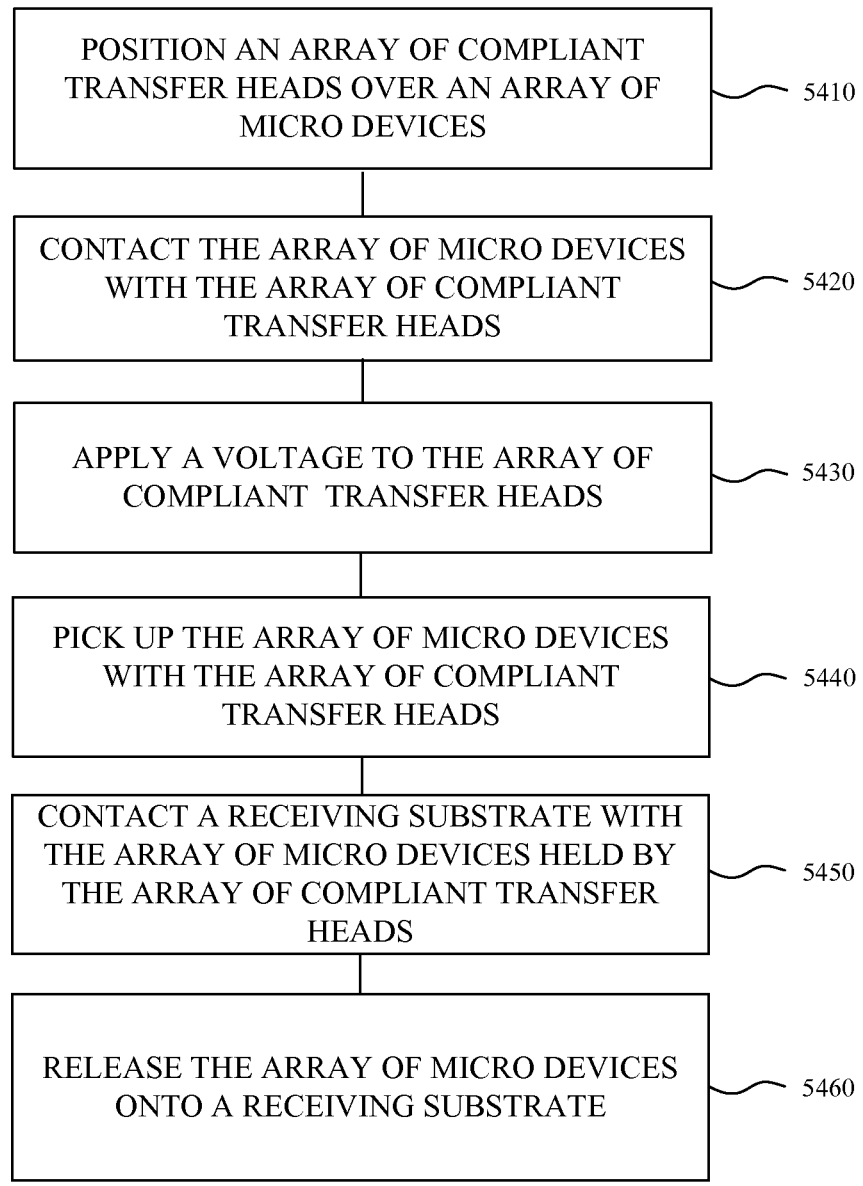
FIG. 54 is a flow chart illustrating a method of picking up and transferring an array of micro devices from a carrier substrate to a receiving substrate in accordance with an embodiment.
Figure 57:
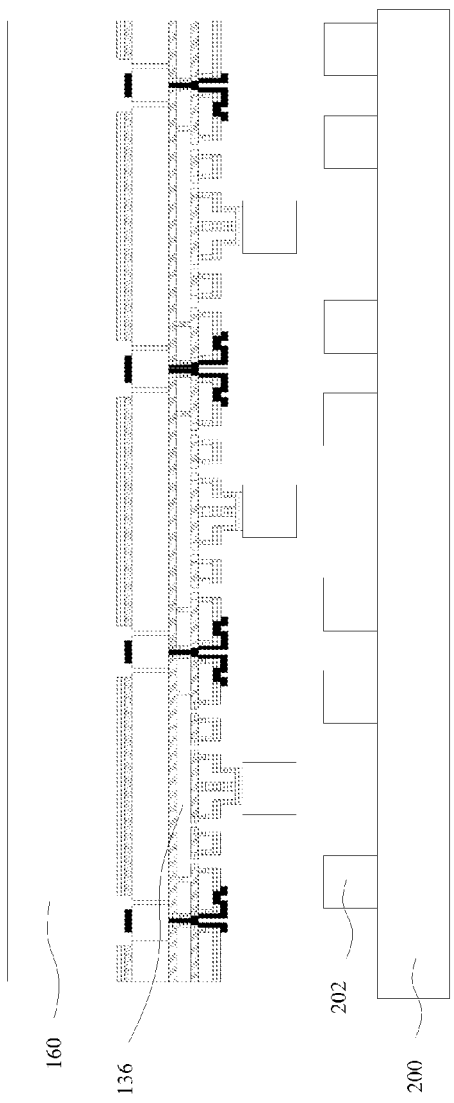
FIG. 57 is a cross-sectional side view illustration of an array of bipolar compliant electrostatic transfer heads picking up an array of micro devices in accordance with an embodiment.
Figure 58:
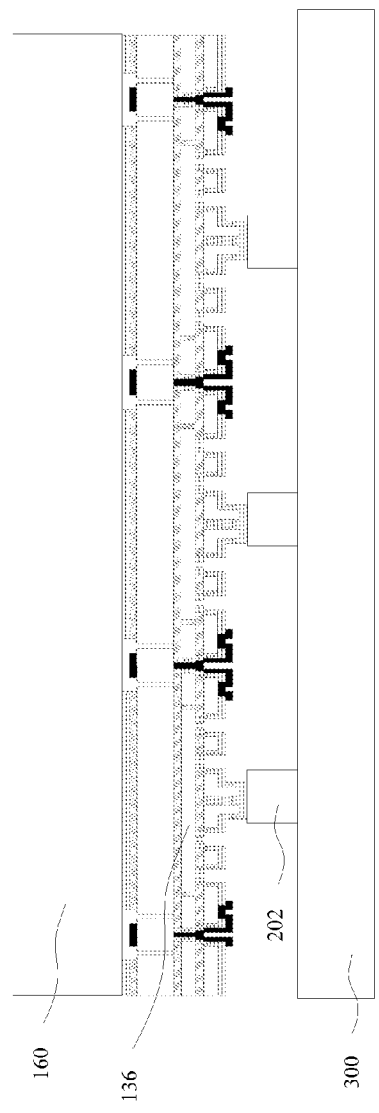
FIG. 58 is a cross-sectional side view illustration of contacting a receiving substrate with an array of micro devices held by an array of bipolar compliant electrostatic transfer heads in accordance with an embodiment.
Figure 59:
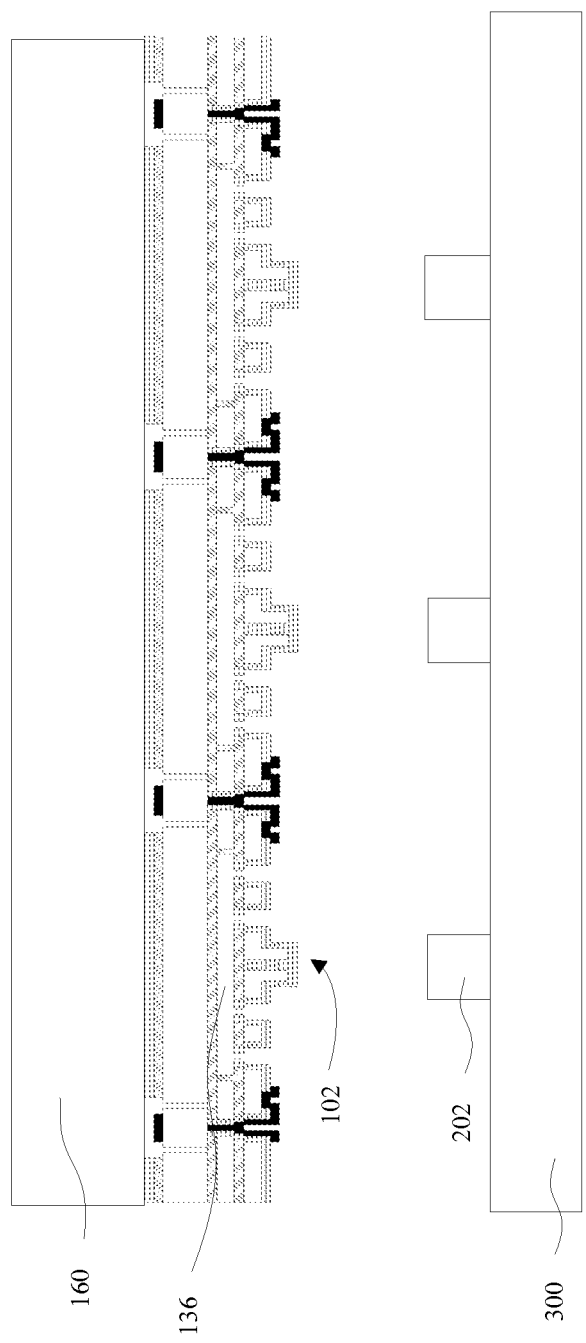
FIG. 59 is a cross-sectional side view illustration of an array of micro devices released onto a receiving substrate in accordance with an embodiment.

FIG. 54 is a flow chart illustrating a method of picking up and transferring an array of micro devices from a carrier substrate to a receiving substrate in accordance with an embodiment. At operation 5410 a micro pick up array including an array of bipolar compliant electrostatic transfer heads is positioned over an array of micro devices on a carrier substrate. FIG. 55 is a cross-sectional side view illustration of an array of bipolar compliant electrostatic transfer heads 102 positioned over an array of micro devices on a carrier substrate 200 in accordance with an embodiment. At operation 5420 the array of micro devices are contacted with the array of bipolar compliant electrostatic transfer heads. In an alternative embodiment, the array of bipolar compliant electrostatic transfer heads is positioned over the array of micro devices with a suitable air gap separating them which does not significantly affect the grip pressure, for example, 1 nm to 10 nm. FIG. 56 is a cross-sectional side view illustration of an array of bipolar compliant electrostatic transfer heads 102 in contact with an array of micro devices 202 in accordance with an embodiment. As illustrated, the pitch of the array of bipolar compliant electrostatic transfer heads 102 is an integer multiple of the pitch of the array of micro devices 202. At operation 5430 a voltage is applied to the array of bipolar compliant electrostatic transfer heads 102. The voltage may be applied from the working circuitry within a transfer head assembly 160 in electrical connection with the array of bipolar compliant electrostatic transfer heads through vias 120. At operation 5440 the array of micro devices is picked up with the array of bipolar compliant electrostatic transfer heads. FIG. 57 is a cross-sectional side view illustration of an array of bipolar compliant electrostatic transfer heads 102 picking up an array of micro devices 202 in accordance with an embodiment. At operation 5450 the array of bipolar compliant electrostatic transfer heads contacts the receiving substrate with the array of micro devices 202. FIG. 58 is a cross-sectional side view illustration of contacting a receiving substrate with an array of micro devices held by an array of bipolar compliant electrostatic transfer heads in accordance with an embodiment. At operation 5460 the array of micro devices is then released onto a receiving substrate. For example, the receiving substrate may be, but is not limited to, a display substrate, a lighting substrate, a substrate with functional devices such as transistors or ICs, or a substrate with metal redistribution lines. FIG. 59 is a cross-sectional side view illustration of an array of micro devices 202 released onto a receiving substrate 300 in accordance with an embodiment.

While operations 5410-5460 have been illustrated sequentially in FIG. 54, it is to be appreciated that embodiments are not so limited and that additional operations may be performed and certain operations may be performed in a different sequence. For example, operation 5430 of applying the voltage to create a grip pressure on the micro devices can be performed in various orders. For example, the voltage can be applied prior to contacting the array of micro devices with the array of compliant electrostatic transfer heads, while contacting the micro devices with the array of bipolar compliant electrostatic transfer heads, or after contacting the micro devices with the array of bipolar compliant electrostatic transfer heads.

Where the bipolar compliant electrostatic transfer heads 102 include bipolar silicon electrodes, an alternating voltage is applied across the pair of silicon electrodes in each compliant electrostatic transfer head 102 so that at a particular point when a negative voltage is applied to one silicon electrode, a positive voltage is applied to the other silicon electrode in the pair, and vice versa to create the pickup pressure. Releasing the micro devices from the compliant electrostatic transfer heads 102 may be accomplished with a varied of methods including turning off the voltage sources, lowering the voltage across the pair of silicon electrodes, changing a waveform of the AC voltage, and grounding the voltage sources. Release may also be accomplished by discharge associated with placing the micro devices on the receiving substrate.

In utilizing the various aspects of the embodiments, it would become apparent to one skilled in the art that combinations or variations of the above embodiments are possible for forming a bipolar compliant electrostatic transfer head and head array, and for transferring a micro device and micro device array. Although the embodiments have been described in language specific to structural features and/or methodological acts, it is to be understood that the appended claims is not necessarily limited to the specific features or acts described. The specific features and acts disclosed are instead to be understood as embodiments of the claims useful for illustration.

What is claimed is:
1. A compliant electrostatic transfer head comprising:
a base substrate;
a cavity template layer on the base substrate;
a first confinement layer between the base substrate and the cavity template layer;
a patterned device layer on the cavity template layer, the patterned device layer comprising an electrode that is deflectable toward a cavity in the cavity template layer; and
a second confinement layer between the cavity template layer and the patterned device layer, wherein the second confinement layer spans along a top surface of the cavity template layer and directly above the cavity; and
wherein the cavity includes a bottom surface defined by the first confinement layer and cavity sidewalls defined by the second confinement layer.
2. The compliant electrostatic transfer head of claim 1, wherein the cavity comprises substantially vertical sidewalls.

3. The compliant electrostatic transfer head of claim 1, wherein the second confinement layer is formed directly on the cavity template layer.
4. The compliant electrostatic transfer head of claim 1, further comprising a spring support layer between the cavity template layer and the patterned device layer.
5. The compliant electrostatic transfer head of claim 4, further comprising an insulating layer between the spring support layer and the patterned device layer, wherein the insulating layer electrically insulates the patterned device layer from the spring support layer.
6. The compliant electrostatic transfer head of claim 1, wherein the patterned device layer comprises a pair of electrodes that is deflectable toward the cavity in the cavity template layer, and the electrode is one of the pair of electrodes.
7. The compliant electrostatic transfer head of claim 6, wherein the pair of electrodes includes a first electrode lead integrally formed with a first mesa structure protruding above the first electrode lead, and a second electrode lead integrally formed with a second mesa structure protruding above the second electrode lead.
8. The compliant electrostatic transfer head of claim 7, wherein the patterned device layer further comprises a first trace interconnect integrally formed with a first electrode, and a second trace interconnect integrally formed with a second electrode.
9. The compliant electrostatic transfer head of claim 8, wherein the first and second electrodes form an electrode beam profile extending between the first and second trace interconnects.
10. The compliant electrostatic transfer head claim 9, wherein the each of the first and second electrodes comprises a double bend.
11. The compliant electrostatic transfer head of claim 10, wherein the electrode beam profile comprises an S-shape configuration.
12. The compliant electrostatic transfer head claim 7, wherein the first and second mesa structures are separated by trench characterized by a width of 1.0 um or less, and the trench is filled with a dielectric material.
13. The compliant electrostatic transfer head of claim 1, wherein the first confinement layer and the second confinement layer comprise a same material.
14. The compliant electrostatic transfer head of claim 1, wherein the first confinement layer and the second confinement layer comprise $SiO_2$.
15. The compliant electrostatic transfer head of claim 14, wherein the patterned device layer comprises silicon.
16. The compliant electrostatic transfer head of claim 15, wherein the cavity template layer comprises silicon.
17. The compliant electrostatic transfer head of claim 16, wherein the base substrate comprises silicon.
18. A compliant electrostatic transfer head comprising:
a base substrate;
a cavity template layer on the base substrate;
a first confinement layer between the base substrate and the cavity template layer;
a patterned device layer on the cavity template layer, the patterned device layer comprising an electrode that is deflectable toward a cavity in the cavity template layer; and
a second confinement layer between the cavity template layer and the patterned device layer, wherein the second confinement layer spans along a top surface of the cavity template layer and directly above the cavity;

a spring support layer between the cavity template layer and the patterned device layer; and an insulating layer between the spring support layer and the patterned device layer, wherein the insulating layer electrically insulates the patterned device layer from the spring support layer.

19. The compliant electrostatic transfer head of claim 18, wherein the patterned device layer comprises a pair of electrodes that is deflectable toward the cavity in the cavity template layer, and the electrode is one of the pair of electrodes.

20. The compliant electrostatic transfer head of claim 19, wherein the pair of electrodes includes a first electrode lead integrally formed with a first mesa structure protruding above the first electrode lead, and a second electrode lead integrally formed with a second mesa structure protruding above the second electrode lead.

\* \* \* \* \*